(12) United States Patent
Song et al.

(10) Patent No.: US 12,451,428 B2
(45) Date of Patent: Oct. 21, 2025

(54) INTEGRATED CIRCUIT INCLUDING HIGH-SPEED DEVICE

(71) Applicant: SAMSUNG ELECTRONICS CO., LTD., Suwon-si (KR)

(72) Inventors: Gyeongseok Song, Hwaseong-si (KR); Kyeongjoon Ko, Yongin-si (KR); Jaehyun Park, Seoul (KR); Junhan Bae, Hwaseong-si (KR); Jongjae Ryu, Changwon-si (KR); Nakwon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 606 days.

(21) Appl. No.: 17/837,786

(22) Filed: Jun. 10, 2022

(65) Prior Publication Data
US 2022/0399266 A1    Dec. 15, 2022

(30) Foreign Application Priority Data

Jun. 10, 2021   (KR) .................. 10-2021-0075741
Sep. 14, 2021   (KR) .................. 10-2021-0122771

(51) Int. Cl.
  *H01L 23/528* (2006.01)
  *H10D 84/01* (2025.01)
  *H10D 84/83* (2025.01)

(52) U.S. Cl.
  CPC ....... *H01L 23/528* (2013.01); *H10D 84/0149* (2025.01); *H10D 84/83* (2025.01)

(58) Field of Classification Search
  CPC .......... H01L 27/11807; H01L 23/5226; H01L 23/528; H01L 21/823871;
  (Continued)

(56) References Cited

U.S. PATENT DOCUMENTS 8,624,683 B2    1/2014   Hirota
8,735,257 B2    5/2014   Huang et al.
(Continued)

FOREIGN PATENT DOCUMENTS

JP    2010-165737    *  7/2010    ............. H01L 21/28
KR    10-2013-0042645 A    4/2013

*Primary Examiner* — Britt D Hanley
*Assistant Examiner* — Jason James Greaving
(74) *Attorney, Agent, or Firm* — Sughrue Mion, PLLC

(57) ABSTRACT

An integrated circuit is provided. The integrated circuit includes: an active region extending in a first direction; gate electrodes extending in a second direction in parallel with each other; source/drain regions provided on the active region between the gate electrodes; a first gate contact connected to the gate electrodes and extending in the first direction; a first gate wiring pattern provided in a first wiring layer, electrically connected to the gate electrodes through the first gate contact, and overlapping the first gate contact along a third direction perpendicular to the first and second directions; and source/drain wiring patterns provided in a second wiring layer, electrically connected to the source/drain regions, respectively, extending in parallel with the second direction, and overlapping the source/drain regions along the third direction, the second wiring layer being provided on the first wiring layer.

20 Claims, 18 Drawing Sheets

(58) Field of Classification Search
CPC ......... H01L 21/823475; H01L 27/0207; H01L 27/088; H01L 23/5222; H01L 21/823437; H10D 84/907; H10D 89/10; H10D 84/83; H10D 89/00; H10D 84/975; H10D 84/0186; H10D 84/038; H10D 89/83
See application file for complete search history.

(56) References Cited

U.S. PATENT DOCUMENTS

| | | | | |
|---|---|---|---|---|
| 2009/0095989 | A1* | 4/2009 | Kim .................... | H01L 29/4238 |
| | | | | 257/E29.319 |
| 2015/0372085 | A1* | 12/2015 | Lee ........................ | H10D 89/10 |
| | | | | 257/288 |
| 2016/0043643 | A1* | 2/2016 | Ujita ................... | H01L 27/0207 |
| | | | | 257/392 |
| 2018/0358346 | A1* | 12/2018 | Kim .................... | H01L 29/6681 |

* cited by examiner

INTEGRATED CIRCUIT INCLUDING HIGH-SPEED DEVICE

CROSS-REFERENCE TO RELATED APPLICATIONS

This application is based on and claims priority to Korean Patent Application No. 10-2021-0075741, filed on Jun. 10, 2021, in the Korean Intellectual Property Office, and Korean Patent Application No. 10-2021-0122771, filed on Sep. 14, 2021, in the Korean Intellectual Property Office, the disclosures of which are incorporated by reference herein in their entireties.

BACKGROUND

The present disclosure relates to an integrated circuit, and more particularly, to an integrated circuit including a high-speed device.

As development of semiconductor processes continues, the sizes integrated circuits and devices containing the integrated circuits may decrease. Devices having reduced sizes may provide increased integration density of integrated circuits, which may increase the influence of parasitic components caused by micro-patterns. Parasitic components may limit the operating speed of integrated circuits. Therefore, there is a need for a structure providing both a high integration density and high operation speed of an integrated circuit.

SUMMARY

One or more example embodiments provide an integrated circuit providing a high integration density and a high operating speed.

According to an aspect of an example embodiment, an integrated circuit includes: an active region extending in a first direction; a plurality of gate electrodes extending in a second direction in parallel with each other, the second direction being perpendicular to the first direction; a plurality of source/drain regions provided on the active region between the plurality of gate electrodes; a first gate contact connected to the plurality of gate electrodes and extending in the first direction; at least one first gate wiring pattern provided in a first wiring layer, electrically connected to the plurality of gate electrodes through the first gate contact, and overlapping the first gate contact along a third direction perpendicular to the first direction and the second direction; and a plurality of source/drain wiring patterns provided in a second wiring layer, electrically connected to the plurality of source/drain regions, respectively, extending in parallel with the second direction, and overlapping the plurality of source/drain regions along the third direction, the second wiring layer being provided on the first wiring layer. The first gate contact overlaps at least one of the plurality of source/drain wiring patterns along the third direction.

According to an aspect of an example embodiment, an integrated circuit includes: an active region extending in a first direction; a plurality of gate electrodes extending in a second direction in parallel with each other, the second direction being perpendicular to the first direction; a plurality of source regions each provided on the active region between gate electrodes and electrically connected to each other; a plurality of drain regions each provided on the active region between gate electrodes and electrically connected to each other; source wiring patterns electrically connected to the plurality of source regions, respectively, and extending in the second direction from regions which overlap the plurality of source regions, along a third direction perpendicular to the first direction and the second direction; and drain wiring patterns electrically connected to the plurality of drain regions, respectively, and extending in an opposite direction to the second direction from regions which overlap the plurality of drain regions, along the third direction.

According to an aspect of an example embodiment, an integrated circuit includes: an active region extending in a first direction; a plurality of gate electrodes extending in a second direction in parallel with each other and forming a plurality of transistors on the active region, the second direction being perpendicular to the first direction; a first gate contact connected to the plurality of gate electrodes and extending in the first direction; at least one first gate wiring pattern provided in a first wiring layer, and electrically connected to the first gate contact; and a plurality of source/drain wiring patterns provided in a second wiring layer above the first wiring layer, electrically connected to sources and drains of the plurality of transistors, respectively, and extending in parallel with the second direction. The at least one first gate wiring pattern extends to a region between the first gate contact and at least one of the plurality of source/drain wiring patterns, and the plurality of transistors are connected in parallel to each other.

BRIEF DESCRIPTION OF THE DRAWINGS

The above and other aspects will be more apparent from the following description of example embodiments taken in conjunction with the accompanying drawings in which.

DETAILED DESCRIPTION

Example embodiments will now be described more fully with reference to the accompanying drawings.

Figure 1:
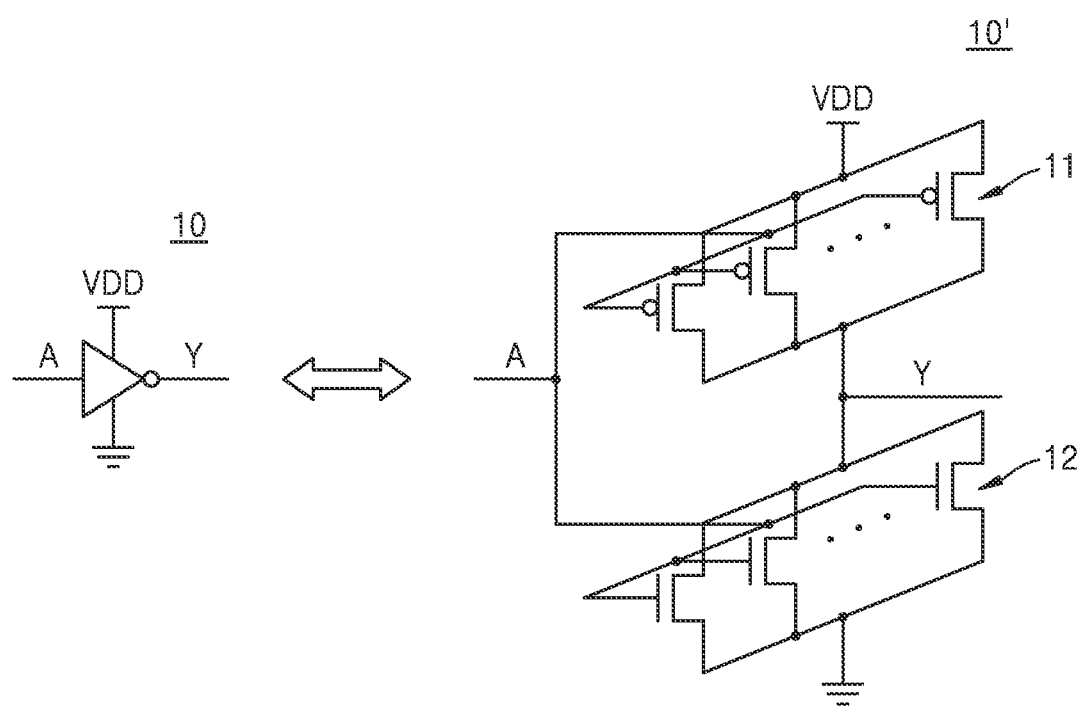
FIG. 1 is a diagram of an inverter according to an example embodiment.

FIG. 1 is a diagram of an inverter according to an example embodiment. In detail, the left side of FIG. 1 shows the symbol of an inverter 10, and the right side of FIG. 1 shows the circuit 10' of the inverter 10. As shown in FIG. 1, electric power may be provided from a positive supply voltage VDD and ground potential (or a negative supply voltage) to the inverter 10, and the inverter 10 may generate an output Y by inverting an input A. The inverter 10 may be included in an integrated circuit manufactured by semiconductor processes.

As an operating speed of the integrated circuit increases, the integrated circuit may consume increased power. To provide the increased power, for example, the positive supply voltage VDD having a high level or the integrated circuit may be designed to consume high current. Semiconductor processes may provide devices having reduced dimensions for a high integration density, and accordingly, an integrated circuit may include a plurality of devices, which are connected in parallel to each other and consume the high current for providing a high operating speed. For example, as shown in FIG. 1, the circuit 10' of the inverter 10 may include a plurality of p-channel field-effect transistors (PFETs) 11 connected in parallel to each other and a plurality of n-channel field-effect transistors (NFETs) 12 connected in parallel to each other. The PFETs 11 may include gates connected to each other, drains connected to each other, and sources connected to each other. The NFETs 12 may include gates connected to each other, drains connected to each other, and sources connected to each other. Accordingly, the PFETs 11 connected in parallel to each other may function as a single large PFET, i.e., a high-speed device, which consumes high current and provides a high operating speed. The NFETs 12 connected in parallel to each other may function as a single large NFET, i.e., a high-speed device, which consumes high current and provides a high operating speed.

The integrated circuit may be manufactured by semiconductor processes including a plurality of sub-processes. With the development of semiconductor processes, the dimensions of patterns formed by sub-processes may be reduced. Accordingly, the integrated circuit may have a high integration density, and the influence of parasitic components may be increased due to the patterns having the reduced dimensions. For example, as the channel length of a transistor decreases, the resistance of a gate electrode may increase, and the capacitance between a source and a drain may increase. In addition, as the distance between wires decreases, the capacitance between the wires may increase. An integrated circuit for high-speed applications, such as peripheral component interconnect express (PCIe) Gen 3 and PCIe Gen 4, may be required to have a high operating speed. The parasitic components described above may limit the increase in operating speed of the integrated circuit. Accordingly, it may be important to provide decreased parasitic components in a structure including a plurality of transistors connected in parallel to each other, for a high operating speed.

As described below with reference to the accompanying drawings, parasitic components may be decreased in an integrated circuit that is manufactured by semiconductor processes providing a high integration density through transistors having reduced dimensions. Because of the decreased parasitic components, a high operating speed of an integrated circuit may be accomplished. Because of the high integration density and high operating speed of the integrated circuit, the performance and efficiency of an application including the integrated circuit may also be enhanced.

FIGS. 2A, 2B, 2C, 2D, 2E and 2F are plan views of the layouts of integrated circuits, according to example embodiments. In detail, the plan views of FIGS. 2A, 2B, 2C and 2D respectively show layouts resulting from sequentially adding layers in a layout corresponding to transistors connected in parallel to each other according to example embodiments. The plan views of FIGS. 2A, 2B, 2C, 2E and 2F respectively show layouts resulting from sequentially adding layers in a layout corresponding to transistors connected in parallel to each other according to example embodiments.

Here, an X-axis direction and a Y-axis direction may be respectively referred to as a first direction and a second direction, and a Z-axis direction may be referred to as a vertical direction. A plane defined by an X-axis and a Y-axis may be referred to as a horizontal plane. An element positioned in a +Z direction relative to another element may be considered as being above the other element. An element positioned in a —Z direction relative to another element may be considered as being below the other element. The area of an element may refer to a size occupied by the element in a plane parallel with the horizontal plane, and the height of the element may refer to a length of the element in the Y-axis direction. The length of the element may refer to a length of the element in a direction in which the element extends, and the width of the element may refer to a length of the element in a direction perpendicular to the direction in which the element extends. For example, the length of a pattern extending in parallel with the X-axis may refer to an X-axis direction length, and the width of the pattern may refer to a Y-axis direction length. In the accompanying drawings, only some layers may be illustrated for convenience of illustration, and a pattern, e.g., the pattern of a wiring layer, which includes a conductive material, may be referred to as a conductive pattern or simply a pattern.

Figure 2A:
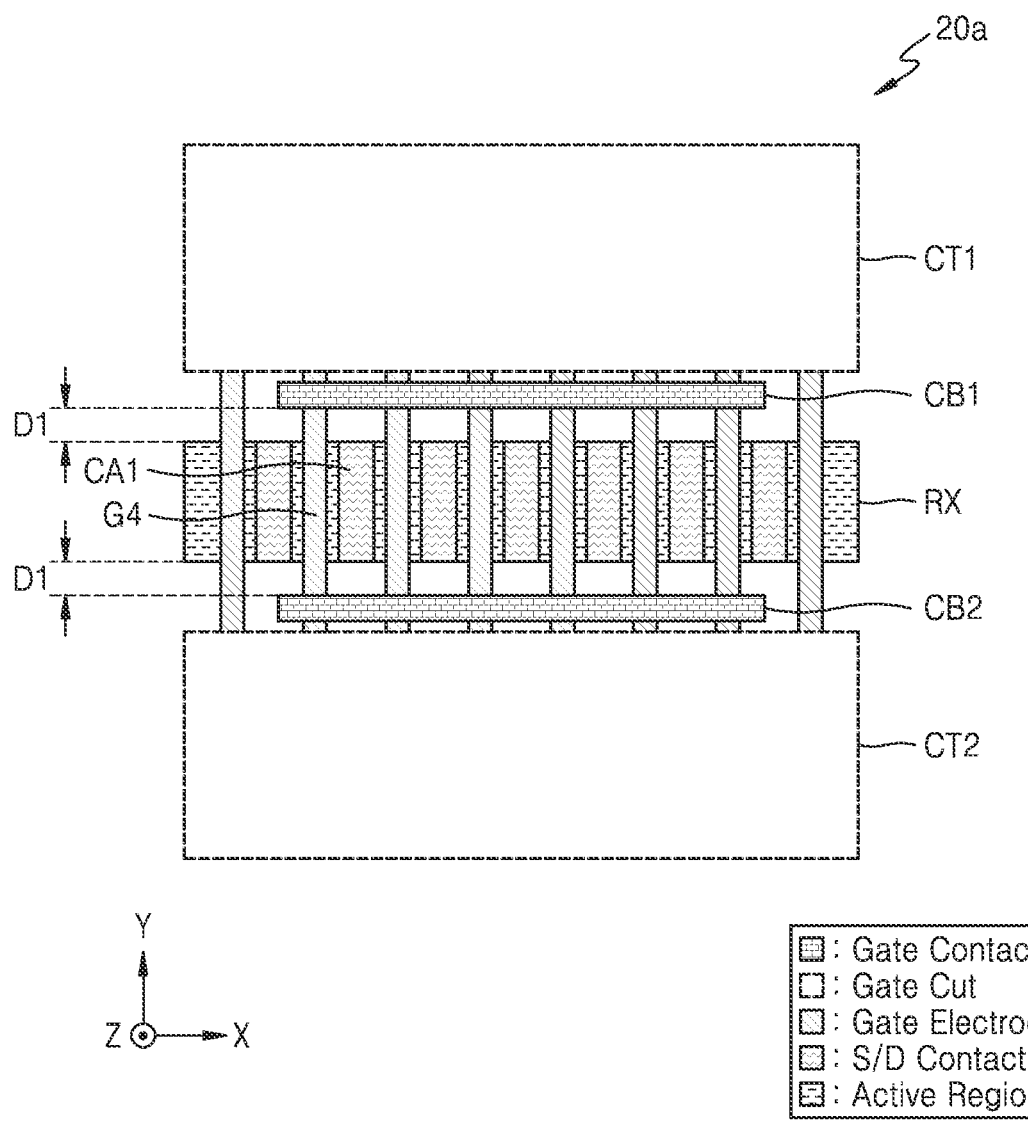
FIGS. 2A, 2B, 2C, 2D, 2E and 2F are plan views of layouts of integrated circuits, according to example embodiments.

Referring to FIG. 2A, a layout 20a may include an active region RX extending in parallel with the X-axis. The active region RX may be referred to as a device region. A device, e.g., a transistor, may be formed in the active region RX. For example, when the active region RX is doped with P-type dopants, an NFET may be formed in the active region RX. When the active region RX is doped with N-type dopants, a PFET may be formed in the active region RX.

The layout 20a may include a series of gate electrodes extending in parallel with the Y-axis. For example, a fourth gate electrode G4 may extend in parallel with the Y-axis. A gate electrode may cross at least one active pattern, which extends on the active region RX, and form a transistor. The two outermost gate electrodes, among eight gate electrodes in FIG. 2A, may correspond to dummy gate electrodes and may not form transistors. Accordingly, the layout 20a may include six transistors formed by six gate electrodes. As a non-limiting example, a gate electrode may include Ti, Ta, W, Al, Co, or a combination of at least two thereof or include Si or SiGe that is nonmetal. The gate electrode may be formed by stacking at least two conductive materials. For example, the gate electrode may include a work function control film, which includes TiN, TaN, TiC, TaC, TiAlC, or a combination of at least two thereof, and a filling conductive film, which includes W or Al.

In some example embodiments, as described below with reference to FIGS. 4A and 4B, an active pattern having a fin shape may extend on the active region RX in parallel with the X-axis, and an integrated circuit may include a fin field-effect transistor (FinFET), which is formed by the active pattern and a gate electrode. In some example embodiments, an active pattern may pass through a gate electrode, and an integrated circuit may include a gate-all-around FET (GAAFET), which is formed by an active pattern and a gate electrode. In some example embodiments, as described below with reference to FIGS. 5A and 5B, an active pattern may include a plurality of nanosheets, which are separated from each other in a direction parallel with the Y-axis or the Z-axis and extend in parallel with the X-axis, and an integrated circuit may include a multi-bridge channel FET (MBCFET), which is formed by the active pattern and a gate electrode. In some example embodiments, an integrated circuit may include a ForkFET having a structure, in which an N-type transistor is close to a P-type transistor, by separating nanosheets for the P-type transistor from nanosheets for the N-type transistor with a dielectric wall. In some example embodiments, an integrated circuit may include a vertical FET (VFET) having a structure, in which source/drain regions are separated from each other in the Z-axis direction with a channel region therebetween and a gate electrode surrounds the channel region. In some example embodiments, an integrated circuit may include a complementary FET (CFET), a negative capacitance FET (NCFET), a carbon nanotube (CNT) FET, a bipolar junction transistor, or any other three-dimensional (3D) transistor.

A gate electrode may be terminated by a gate cut. For example, as shown in FIG. 2A, a series of gate electrodes may be terminated by a first gate cut CT1 and a second gate cut CT2. Accordingly, the length of the gate electrodes may be defined by the first gate cut CT1 and the second gate cut CT2. In some example embodiments, gate cuts may be arranged such that a series of gate electrodes have a minimum length. For example, the first gate cut CT1 and the second gate cut CT2 may be arranged such that the gate electrodes are connected to a first gate contact CB1 and a second gate contact CB2, which are described below, and have a minimum length. Accordingly, parasitic capacitance caused by the gate electrodes may be reduced, and the operating speed of the integrated circuit may be increased.

The layout 20a may include source/drain contacts each extending in parallel with the Y-axis between gate electrodes. Source/drain regions may be formed between gate electrodes, respectively, and the source/drain contacts respectively connected to the source/drain regions may extend in parallel with the Y-axis For example, as shown in FIG. 2A, a first source/drain contact CA1 may be provided between two adjacent gate electrodes and extend in parallel with the Y-axis.

The layout 20a may include a gate contact, which is connected to the series of gate electrodes and extends in parallel with the X-axis. For example, as shown in FIG. 2A, the first gate contact CB1 may be connected to six gate electrodes provided between two dummy gate electrodes and forming transistors, and extend in parallel with the X-axis. The second gate contact CB2 may be connected to the six gate electrodes forming transistors and extend in parallel with the X-axis. The six gate electrodes including the fourth gate electrode G4 may be electrically connected to one another by the first gate contact CB1 and the second gate contact CB2.

In some example embodiments, semiconductor processes may require that a gate contact is separated from the active region RX in a direction parallel with the X-axis or the Y-axis. For example, as shown in FIG. 2A, the first gate contact CB1 and the second gate contact CB2 may not be above the active region RX but be separated from the active region RX in a direction parallel with the Y-axis by a first distance D1. Accordingly, a region above the active region RX may be provided between the first gate contact CB1 and the second gate contact CB2. In other words, in the plan view, the active region RX may be provided between the first gate contact CB1 and the second gate contact CB2.

Semiconductor processes may define a minimum space between a gate contact and an active region, and accordingly, the gate contact may be separated from the active region RX in a direction parallel with the X-axis or the Y-axis by at least the minimum space. In some example embodiments, the first gate contact CB1 and the second gate contact CB2 may be arranged to be as close as possible to the active region RX, and the first distance D1 may be equal to the minimum space between a gate contact and an active region. Accordingly, a signal (e.g., the input A in FIG. 1) applied to gates may pass through a reduced section of the gate electrodes having a higher resistance than the patterns of a wiring layer, and the operating speed of the integrated circuit may be increased.

Figure 2B:
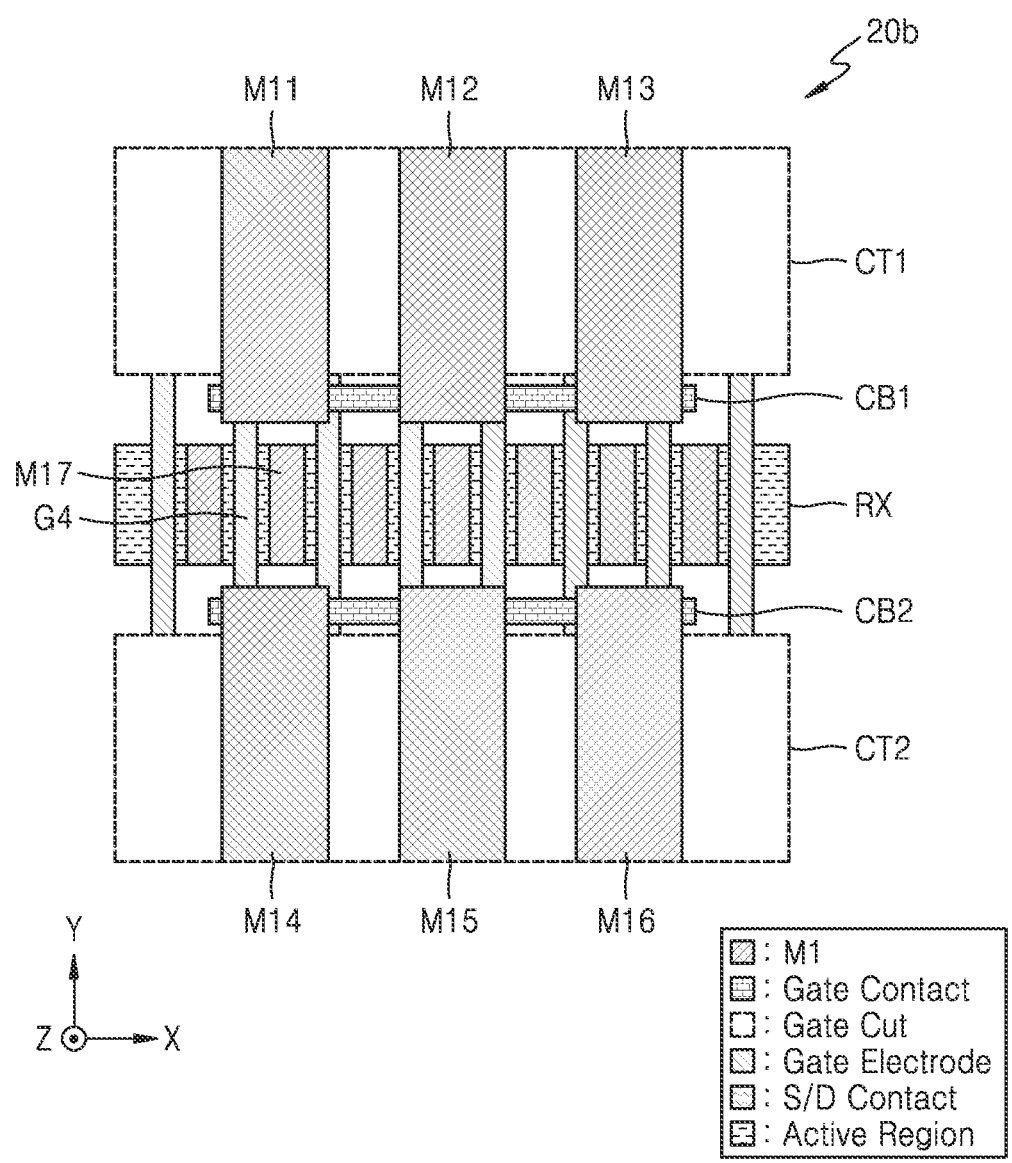

Referring to FIG. 2B, a layout 20b may include patterns of a first wiring layer M1. As described above with reference to FIG. 2A, the layout 20b may include the active region RX extending in parallel with the X-axis. The layout 20b may include a series of gate electrodes including the fourth gate electrode G4 extending in parallel with the Y-axis, and the series of gate electrodes may be terminated by the first gate cut CT1 and the second gate cut CT2. The layout 20b may include source/drain contacts each extending in parallel with the Y-axis between gate electrodes and the first and second gate contacts CB1 and CB2 extending in parallel with the X-axis.

The layout 20b may include patterns, which are electrically connected to a gate contact and extend in the first wiring layer M1 in parallel with the Y-axis. For example, as shown in FIG. 2B, the layout 20b may include first to third patterns M11 to M13, which are electrically connected to the first gate contact CB1 and extend in parallel with the Y-axis in the first wiring layer M1. The layout 20b may also include fourth to sixth patterns M14 to M16, which are electrically connected to the second gate contact CB2 and extend in parallel with the Y-axis in the first wiring layer M1. In some example embodiments, as described below with reference to FIG. 4A and so on, at least one via of a V0 layer may be provided between a pattern of the first wiring layer M1 and a gate contact, and the pattern of the first wiring layer M1 and the gate contact may be electrically connected to each other through the at least one via of the V0 layer. Here, the patterns, i.e., the first to sixth patterns M11 to M16, of the first wiring layer M1, which are electrically connected to the first or second gate contact CB1 or CB2, may be referred to as gate wiring patterns.

The layout 20b may include patterns, which are respectively and electrically connected to the source/drain contacts and extend in the first wiring layer M1 in parallel with the Y-axis. For example, as shown in FIG. 2B, the layout 20b may include a seventh pattern M17, which is electrically connected to the first source/drain contact CA1 in FIG. 2A and extends in parallel with the Y-axis. In some example embodiments, as described below with reference to FIG. 4A and so on, a via of the V0 layer may be provided between the first source/drain contact CA1 and the seventh pattern M17, and the first source/drain contact CA1 and the seventh pattern M17 may be electrically connected to each other through the via of the V0 layer.

As described above with reference to FIG. 2A, the first gate contact CB1 and the second gate contact CB2 may be arranged to be as close as possible to the active region RX in a direction parallel with the Y-axis. The first to third patterns M11 to M13 of the first wiring layer M1 may extend to a region above the first gate contact CB1, and the fourth to sixth patterns M14 to M16 of the first wiring layer M1 may extend to a region above the second gate contact CB2. Accordingly, a signal (e.g., the input A in FIG. 1) applied to gates may pass through a lengthened section of the patterns of the first wiring layer M1, which have a lower resistance than the gate electrodes, and the operating speed of the integrated circuit may be increased.

Figure 2C:
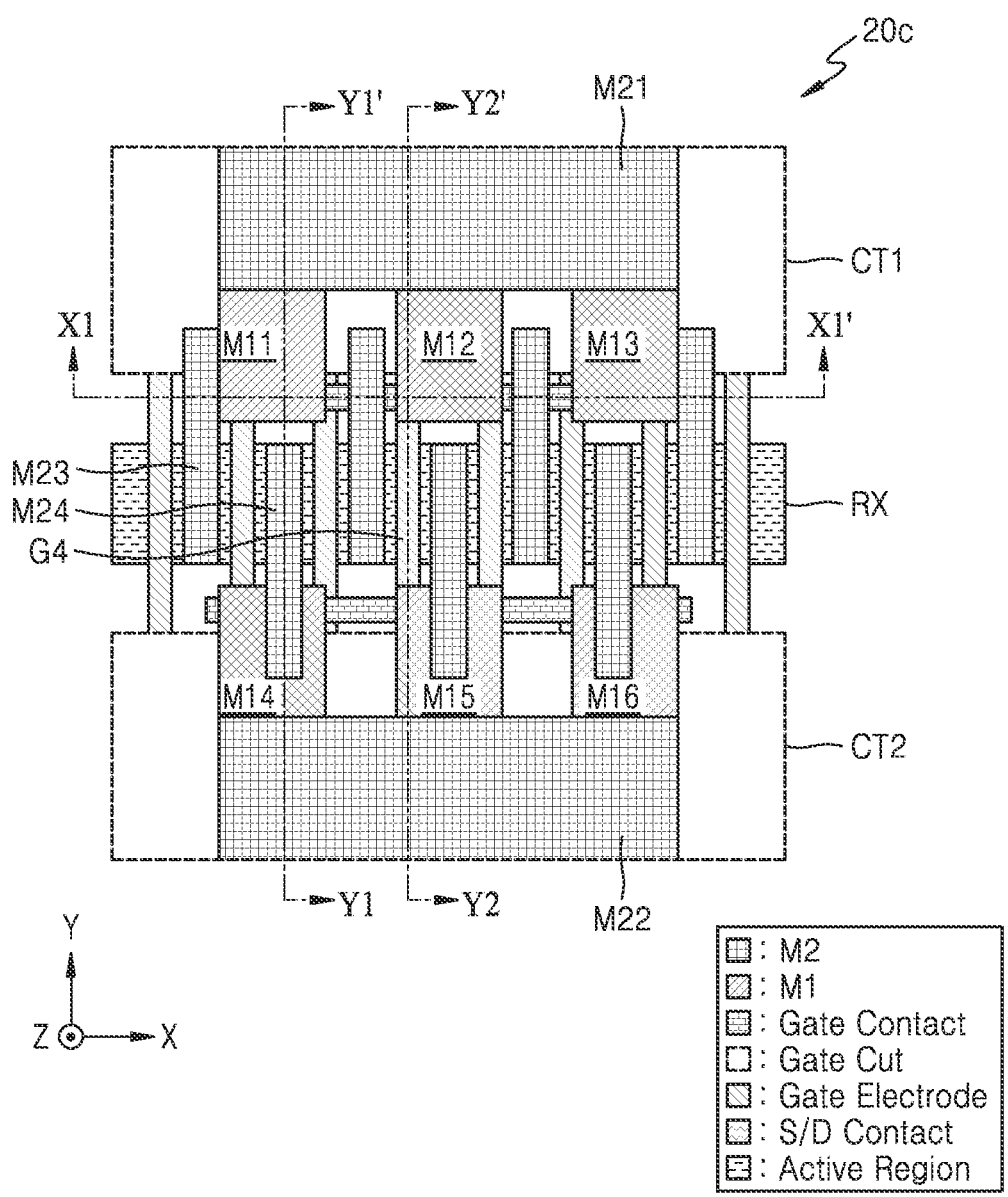

Referring to FIG. 2C, a layout 20c may include patterns of a second wiring layer M2. As described above with reference to FIG. 2A, the layout 20c may include the active region RX extending in parallel with the X-axis. The layout 20c may include a series of gate electrodes including the fourth gate electrode G4 extending in parallel with the Y-axis, and the series of gate electrodes may be terminated by the first gate cut CT1 and the second gate cut CT2. The layout 20c may include source/drain contacts, each extending in parallel with the Y-axis between gate electrodes, and gate contacts extending in parallel with the X-axis. As described above with reference to FIG. 2B, the layout 20c may include patterns, which are respectively and electrically connected to the source/drain contacts and extend in the first wiring layer M1 in parallel with the Y-axis, and the first to sixth patterns M11 to M16, which are electrically connected to a gate contact and extend in the first wiring layer M1 in parallel with the Y-axis.

The layout 20c may include patterns, to which a signal provided to gates is applied and which extend in the second wiring layer M2 in parallel with the X-axis. For example, as shown in FIG. 2C, a first pattern M21 of the second wiring layer M2 may be connected to the first to third patterns M11 to M13 of the first wiring layer M1. A second pattern M22 of the second wiring layer M2 may be connected to the fourth to sixth patterns M14 to M16 of the first wiring layer M1. Accordingly, a signal (e.g., the input A in FIG. 1) provided to the gates may be transmitted from the first and second patterns M21 and M22 of the second wiring layer M2 to the gates through the first to sixth patterns M11 to M16 of the first wiring layer M1 and gate contacts. As described below with reference to FIG. 4A and so on, a pattern of the second wiring layer M2 may be electrically connected to a pattern of the first wiring layer M1 through a via of a V1 layer.

The layout 20c may include patterns, which are respectively and electrically connected to the source/drain contacts and extend in the second wiring layer M2 in parallel with the Y-axis. For example, as shown in FIG. 2C, the layout 20c may include a fourth pattern M24 of the second wiring layer M2, wherein the fourth pattern M24 of the second wiring layer M2 is electrically connected to the seventh pattern M17 in FIG. 2B, which is electrically connected to the first source/drain contact CA1 in FIG. 2A, and extends in parallel with the Y-axis. In some example embodiments, as described below with reference to FIG. 4A and so on, a pattern of the second wiring layer M2 may be electrically connected to a pattern of the first wiring layer M1 through a via of the V1 layer. Here, patterns of the second wiring layer M2, which are electrically connected to the source/drain contacts, may be referred to as source/drain wiring patterns.

The source/drain wiring patterns may include a source pattern, which is electrically connected to a source region of a transistor, and a drain pattern, which is electrically connected to a drain region of the transistor. The source pattern and the drain pattern may extend in opposite directions in parallel with each other. The source pattern and the drain pattern may overlap with each other along the first (X-axis) direction over the active region Rx. For example, a third pattern M23 of the second wiring layer M2 may be electrically connected to a source region (or a drain region) of a transistor through a source/drain contact and extend in a +Y-axis direction from a region above the source region (or a region above the source/drain contact and the active region RX). The fourth pattern M24 of the second wiring layer M2 may be electrically connected to a drain region (or a source region) of a transistor through a source/drain contact and extend in a —Y-axis direction from a region above the drain region (or a region above the source/drain contact and the active region RX). Accordingly, a section, in which the third and fourth patterns M23 and M24 of the second wiring layer M2 overlap each other in a direction parallel with the X-axis, e.g., a section corresponding to the width of the active region RX, may be reduced, and the capacitance between the third and fourth patterns M23 and M24 of the second wiring layer M2 may be decreased. As shown in FIG. 2C, the fourth pattern M24 of the second wiring layer M2 may extend to a region above the fourth pattern M14 of the first wiring layer M1.

A cross-section of the layout 20c taken along a line X1-X1' is described with reference to FIG. 3 below. Examples of a cross-section of the layout 20c taken along a line Y1-Y1' are described with reference to FIGS. 4A and 5A below. Examples of a cross-section of the layout 20c taken along a line Y2-Y2' are described with reference to FIGS. 4B and 5B below.

Figure 2D:
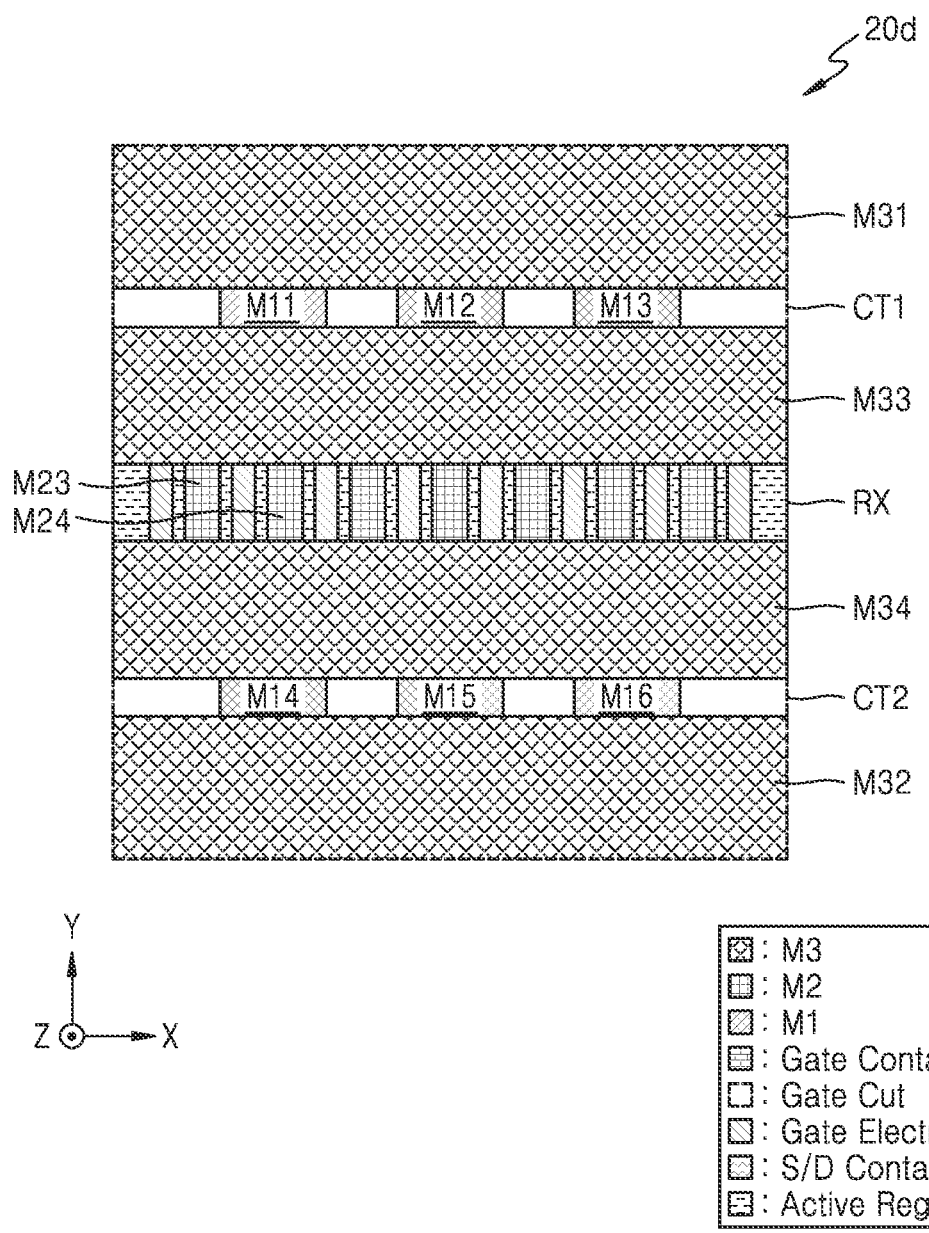

Referring to FIG. 2D, a layout 20d may include patterns of a third wiring layer M3. As described above with reference to FIG. 2A, the layout 20d may include the active region RX extending in parallel with the X-axis. The layout 20d may include a series of gates extending in parallel with the Y-axis, and the series of gates may be terminated by the first gate cut CT1 and the second gate cut CT2. The layout 20d may include the first to sixth patterns M11 to M16 of the first wiring layer M1, which are electrically connected to a gate contact, as described above with reference to FIG. 2B, and the third and fourth patterns M23 and M24 of the second wiring layer M2, which are electrically connected to a source/drain contact, as described above with reference to FIG. 2C.

The layout 20d may include patterns, which are electrically connected to gate electrodes and extend in the third wiring layer M3 in parallel with the X-axis. For example, as shown in FIG. 2D, a first pattern M31 of the third wiring layer M3 may be electrically connected to the first pattern M21 of the second wiring layer M2 in FIG. 2C through a via. A second pattern M32 of the third wiring layer M3 may be electrically connected to the second pattern M22 of the second wiring layer M2 in FIG. 2C through a via. Due to the first and second patterns M31 and M32 of the third wiring layer M3, which have a relatively wide width, the interconnection resistance between gate electrodes may be decreased.

The layout 20d may include patterns, which are electrically connected to source/drain electrodes and extend in the third wiring layer M3 in parallel with the X-axis. For example, as shown in FIG. 2D, a third pattern M33 of the third wiring layer M3 may be electrically connected, through vias, to patterns of the second wiring layer M2, which are respectively and electrically connected to source regions (or drain regions) and extend in the +Y-axis direction like the third pattern M23 of the second wiring layer M2. A fourth pattern M34 of the third wiring layer M3 may be electrically connected, through vias, to patterns of the second wiring layer M2, which are respectively and electrically connected to drain regions (or source regions) and extend in the —Y-axis direction like the fourth pattern M24 of the second wiring layer M2. Due to the third and fourth patterns M33 and M34 of the third wiring layer M3, which have a relatively wide width, the interconnection resistance between source regions and the interconnection resistance between drains regions may be decreased.

In some example embodiments, a pattern extending in parallel with the X-axis may be formed in an upper wiring layer above the third wiring layer M3. For example, high-speed devices, each of which is constituted with a plurality of transistors connected in parallel to each other, may be connected to each other by patterns formed in the upper wiring layer, and accordingly, a layout may include patterns which extend in the upper wiring layer above the third wiring layer M3 in parallel with the X-axis, similarly to the first to fourth patterns M31 to M34 of the third wiring layer M3 in FIG. 2D. To electrically connect patterns of the second wiring layer M2 to patterns of the upper wiring layer, the layout may also include vias between the third wiring layer M3 and the upper wiring layer and patterns of at least one wiring layer. Examples of an integrated circuit including patterns, which extend in a fourth wiring layer M4 in parallel with the X-axis, as examples of patterns that extend in an upper wiring layer above the third wiring layer M3 in parallel with the X-axis, are described below with reference to FIGS. 2E and 2F.

Figure 2E:
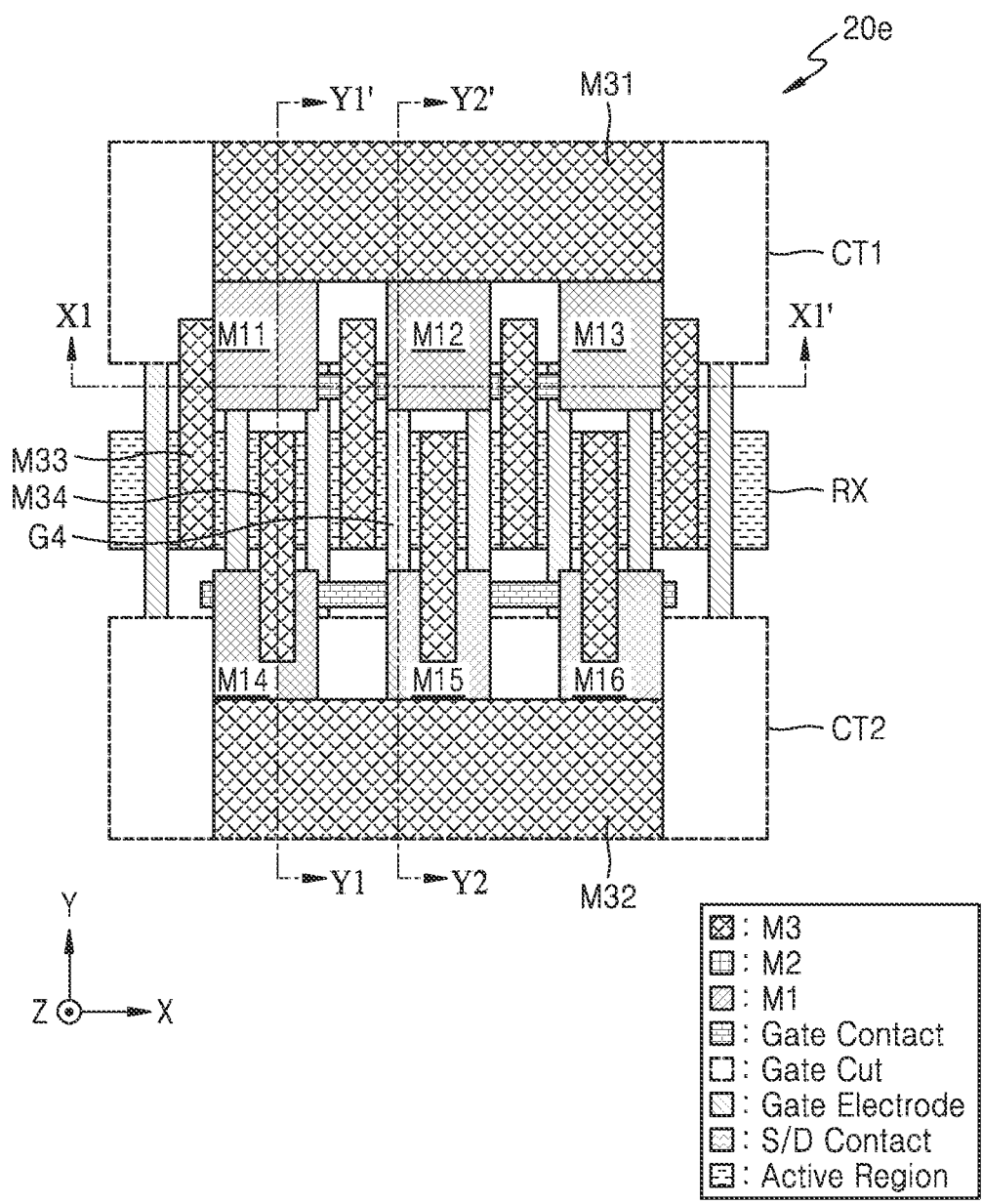

Referring to FIG. 2E, a layout 20e may include patterns in the third wiring layer M3, wherein the patterns have the same shapes as patterns of the second wiring layer M2. As shown in FIG. 2E, the layout 20e may include the active region RX extending in parallel with the X-axis. The layout 20e may include a series of gate electrodes including the fourth gate electrode G4 extending in parallel with the Y-axis, and the series of gate electrodes may be terminated by the first gate cut CT1 and the second gate cut CT2. The layout 20e may include source/drain contacts extending in parallel with the Y-axis among the series of gate electrodes and gate contacts extending in parallel with the X-axis. As described above with reference to FIG. 2B, the layout 20e may include patterns, which are respectively and electrically connected to the source/drain contacts and extend in the first wiring layer M1 in parallel with the Y-axis, and the first to sixth patterns M11 to M16, which are electrically connected to a gate contact and extend in the first wiring layer M1 in parallel with the Y-axis.

As described above with reference to FIG. 2C, the layout 20e may include patterns, to which a signal provided to gates is applied and which extend in the second wiring layer M2 in parallel with the X-axis. The layout 20e may also include patterns, which are respectively and electrically connected to the source/drain contacts and extend in the second wiring layer M2 in parallel with the Y-axis. The layout 20e my include patterns of the third wiring layer M3, which have the same shapes as patterns of the second wiring layer M2 and are respectively and electrically connected to the patterns of the second wiring layer M2 through vias.

As shown in FIG. 2E, the first pattern M31 of the third wiring layer M3 may be connected to the first to third patterns M11 to M13 of the first wiring layer M1 through the first pattern M21 of the second wiring layer M2 in FIG. 2C. The second pattern M32 of the third wiring layer M3 may be connected to the fourth to sixth patterns M14 to M16 of the first wiring layer M1 through the second pattern M22 of the second wiring layer M2 in FIG. 2C. Accordingly, a signal (e.g., the input A in FIG. 1) provided to the gates may be transmitted from the first and second patterns M31 and M32 of the third wiring layer M3 to the gates through the first and second patterns M21 and M22 of the second wiring layer M2, the first to sixth patterns M11 to M16 of the first wiring layer M1, and gate contacts. A pattern of the third wiring layer M3 may be electrically connected to a pattern of the second wiring layer M2 through a via of a second via layer.

As shown in FIG. 2E, the layout 20e may include the third pattern M33 of the third wiring layer M3, which has the same shape as the third pattern M23 of the second wiring layer M2 in FIG. 2C and is electrically connected to the third pattern M23 of the second wiring layer M2. The layout 20e may also include the fourth pattern M34 of the third wiring layer M3, which has the same shape as the fourth pattern M24 of the second wiring layer M2 in FIG. 2C and is electrically connected to the fourth pattern M24 of the second wiring layer M2.

Figure 2F:
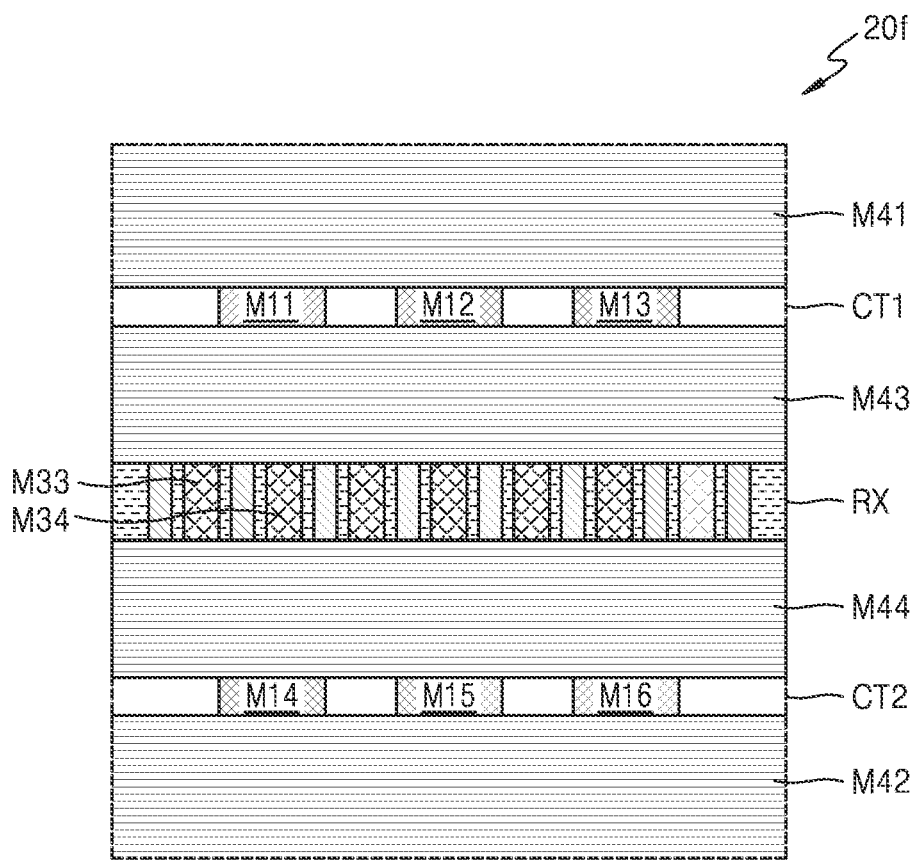

Referring to FIG. 2F, a layout 20f may include patterns of a fourth wiring layer M4. The layout 20f may include the active region RX extending in parallel with the X-axis. The layout 20f may include a series of gates extending in parallel with the Y-axis, and the series of gates may be terminated by the first gate cut CT1 and the second gate cut CT2. The layout 20f may include the first to sixth patterns M11 to M16 of the first wiring layer M1, which are electrically connected to a gate contact, as described above with reference to FIG. 2B, and the third and fourth patterns M23 and M24 of the second wiring layer M2, which are electrically connected to a source/drain contact, as described above with reference to FIG. 2C. The layout 20f may also include the patterns of the third wiring layer M3 in FIG. 2E.

The layout 20f may include patterns, which are electrically connected to gate electrodes and extend in the fourth wiring layer M4 in parallel with the X-axis. For example, as shown in FIG. 2F, a first pattern M41 of the fourth wiring layer M4 may be electrically connected to the first pattern M31 of the third wiring layer M3 in FIG. 2E through a via. A second pattern M42 of the fourth wiring layer M4 may be electrically connected to the second pattern M32 of the third wiring layer M3 in FIG. 2E through a via. Due to the first and second patterns M41 and M42 of the fourth wiring layer M4, which have a relatively wide width, a resistance of interconnection between gate electrodes may be decreased.

The layout 20f may include patterns, which are electrically connected to source/drain electrodes and extend in the fourth wiring layer M4 in parallel with the X-axis. For example, as shown in FIG. 2F, a third pattern M43 of the fourth wiring layer M4 may be electrically connected, through vias, to patterns of the third wiring layer M3, which are respectively and electrically connected to source regions (or drain regions) and extend in the +Y-axis direction like the third pattern M33 of the third wiring layer M3. A fourth pattern M44 of the fourth wiring layer M4 may be electrically connected, through vias, to patterns of the third wiring layer M3, which are respectively and electrically connected to drain regions (or source regions) and extend in the —Y-axis direction like the fourth pattern M34 of the third wiring layer M3. Due to the third and fourth patterns M43 and M44 of the fourth wiring layer M4, which have a relatively broad width, the interconnection resistance between source regions and the interconnection resistance between drains regions may be decreased.

Figure 3:
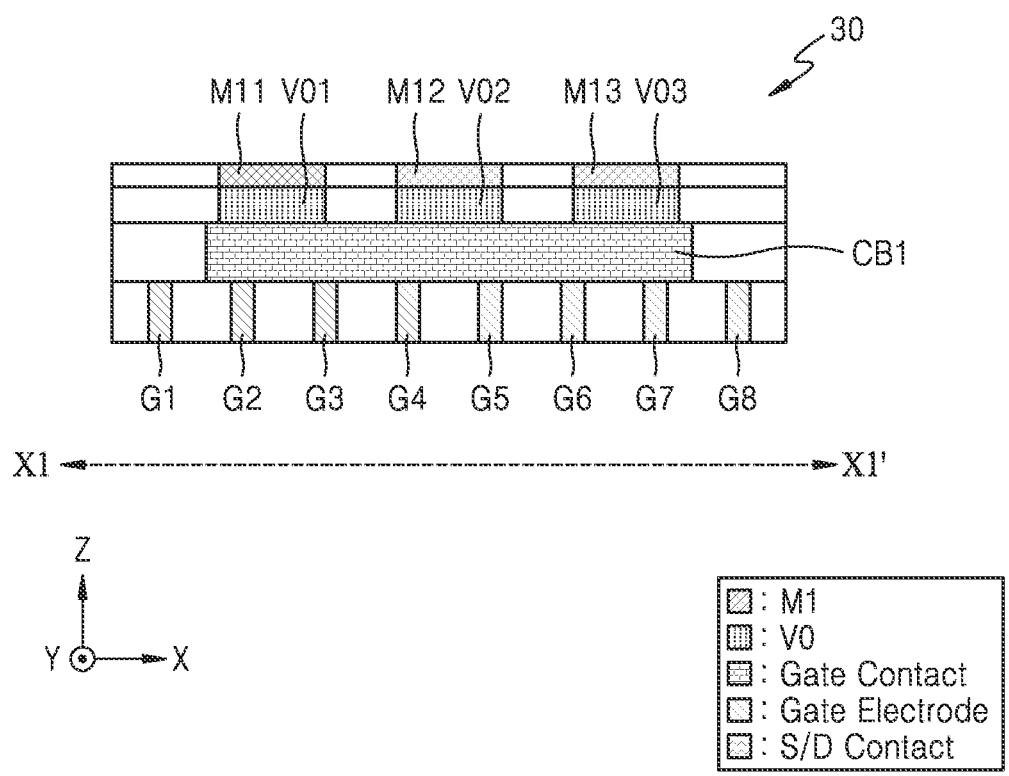
FIG. 3 is a cross-sectional view of a layout of an integrated circuit, according to an example embodiment.

FIG. 3 is a cross-sectional view of the layout of an integrated circuit, according to an example embodiment. In detail, the cross-sectional view of FIG. 3 shows an example of the cross-section of the layout 20c of FIG. 2C, taken along the line X1-X1'.

Referring to FIG. 3, a layout 30 may be formed on a substrate. The substrate may correspond to bulk silicon or silicon-on-insulator (SOI). As a non-limiting example, the substrate may include SiGe, silicon-germanium-on-insulator (SGOI), InSb, a PbTe compound, InAs, phosphide, GaAs, or GaSb. The layout 30 may include a series of gate electrodes. For example, as shown in FIG. 3, the layout 30 may include first to eighth gate electrodes G1 to G8 arranged in a line in a direction parallel with the X-axis. As described above with reference to FIG. 2A, the outermost gate electrodes, i.e., the first and eighth gate electrodes G1 and G8, among the first to eighth gate electrodes G1 to G8 may correspond to dummy gate electrodes, and the second to seventh gate electrodes G2 to G7 may respectively form transistors.

A gate contact extending in parallel with the X-axis may be formed on gate electrodes. For example, as shown in FIG. 3, the first gate contact CB1, which is connected to the second to seventh gate electrodes G2 to G7 respectively forming transistors and extends in parallel with the X-axis, may be formed. The second to seventh gate electrodes G2 to G7 may be electrically connected to one another through the first gate contact CB1.

Vias of the V0 layer may be provided on a gate contact, and patterns of the first wiring layer M1 may be electrically connected to the gate contact through the vias. For example, as shown in FIG. 3, first to third vias V01 to V03 of the V0 layer may be formed on the first gate contact CB1, and the first to third patterns M11 to M13 of the first wiring layer M1 may be electrically connected to the first gate contact CB1 respectively through the first to third vias V01 to V03. In some example embodiments patterns of the first wiring layer M1 may be connected to a gate contact through at least two vias of the V0 layer. For example, the first via V01 of the V0 layer may include two separate vias, and the first pattern M11 of the first wiring layer M1 may be electrically connected to the first gate contact CB1 through the two separate vias. In some example embodiments the V0 layer may be omitted, and patterns of the first wiring layer M1 may be directly connected to the first gate contact CB1.

Figure 4A:
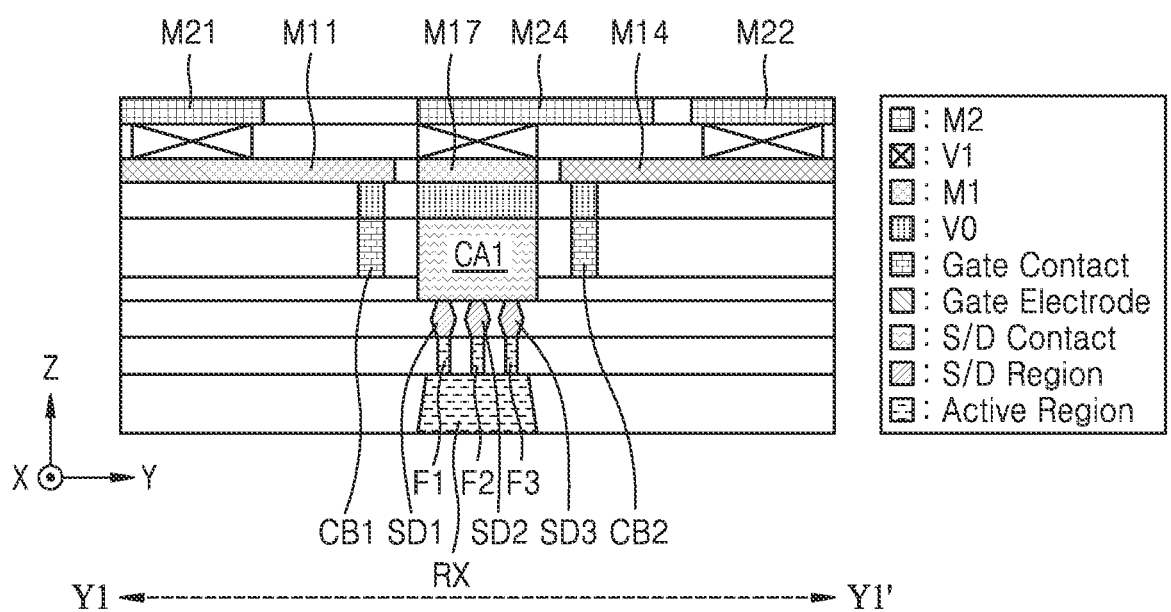
FIGS. 4A and 4B are cross-sectional views illustrating cross-sections of an integrated circuit, according to example embodiments.
Figure 4B:
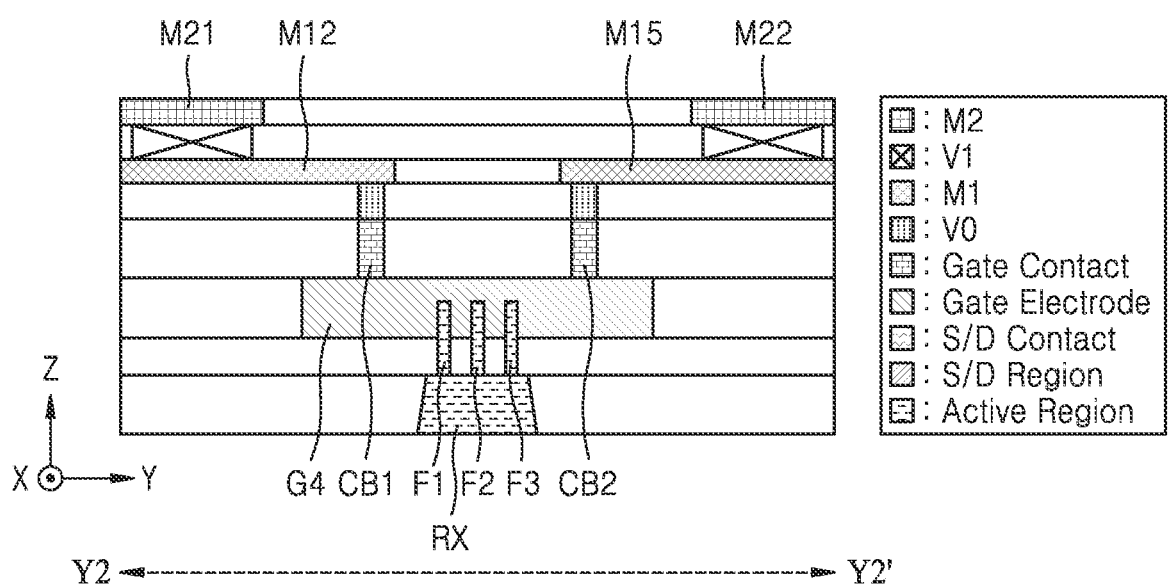

FIGS. 4A and 4B are cross-sectional views illustrating cross-sections of an integrated circuit, according to example embodiments. In detail, the cross-sectional view of FIG. 4A shows an example of the cross-section of the layout 20c of FIG. 2C, taken along the line Y1-Y1'. The cross-sectional view of FIG. 4B shows an example of the cross-section of the layout 20c of FIG. 2C, taken along the line Y2-Y2'. In the examples of FIGS. 4A and 4B, an integrated circuit may include a FinFET. Although it is illustrated in FIGS. 4A and 4B that the FinFET includes three fins, example embodiments are not limited thereto and a FinFET may include a different number of fins than the FinFET in FIGS. 4A and 4B. In some example embodiments, the V0 layer in FIGS. 4A and 4B may be omitted, and a source/drain contact and a gate contact may be directly connected to a pattern of the first wiring layer M1.

Referring to FIG. 4A, at least one fin may extend on the active region RX in parallel with the X-axis, and a source/drain region may be formed on the fin. For example, as shown in FIG. 4A, first to third fins F1 to F3 may extend on the active region RX in parallel with the X-axis, and first to third source/drain regions SD1 to SD3 may be respectively formed on the first to third fins F1 to F3. In some example embodiments the first to third source/drain regions SD1 to SD3 may be merged into a single source/drain region.

The first source/drain contact CA1 may be formed on the first to third source/drain regions SD1 to SD3 and electrically connected to the seventh pattern M17 of the first wiring layer M1 through a via of the V0 layer. The seventh pattern M17 of the first wiring layer M1 may be electrically connected to the fourth pattern M24 of the second wiring layer M2 through a via of the V1 layer. Accordingly, the fourth pattern M24 of the second wiring layer M2 may be electrically connected to the first to third source/drain regions SD1 to SD3.

Referring to FIG. 4B, the fourth gate electrode G4 may extend in parallel with the Y-axis and cross the first to third fins F1 to F3. A gate dielectric film may be formed between the first to third fins F1 to F3 and the fourth gate electrode G4. The first gate contact CB1 and the second gate contact CB2 may be formed on the fourth gate electrode G4 and respectively and electrically connected to the second and fifth patterns M12 and M15 of the first wiring layer M1 through vias of the V0 layer. The second and fifth patterns M12 and M15 of the first wiring layer M1 may be respectively and electrically connected to the first and second patterns M21 and M22 of the second wiring layer M2 through vias of the V1 layer. In some example embodiments, a gate spacer may be formed on a side surface of the fourth gate electrode G4, and a gate dielectric film may be formed between the fourth gate electrode G4 and the gate spacer and on the bottom surface of the fourth gate electrode G4. A barrier film may be formed on the surface of a contact and/or a via.

Figure 5A:
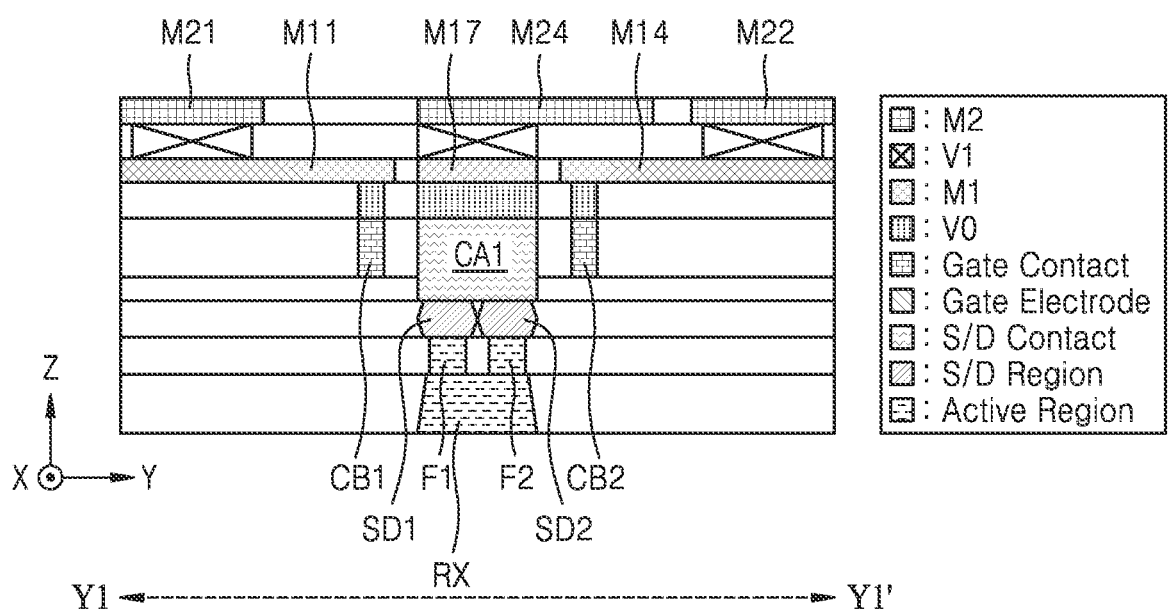
FIGS. 5A and 5B are cross-sectional views illustrating cross-sections of an integrated circuit, according to example embodiments.
Figure 5B:
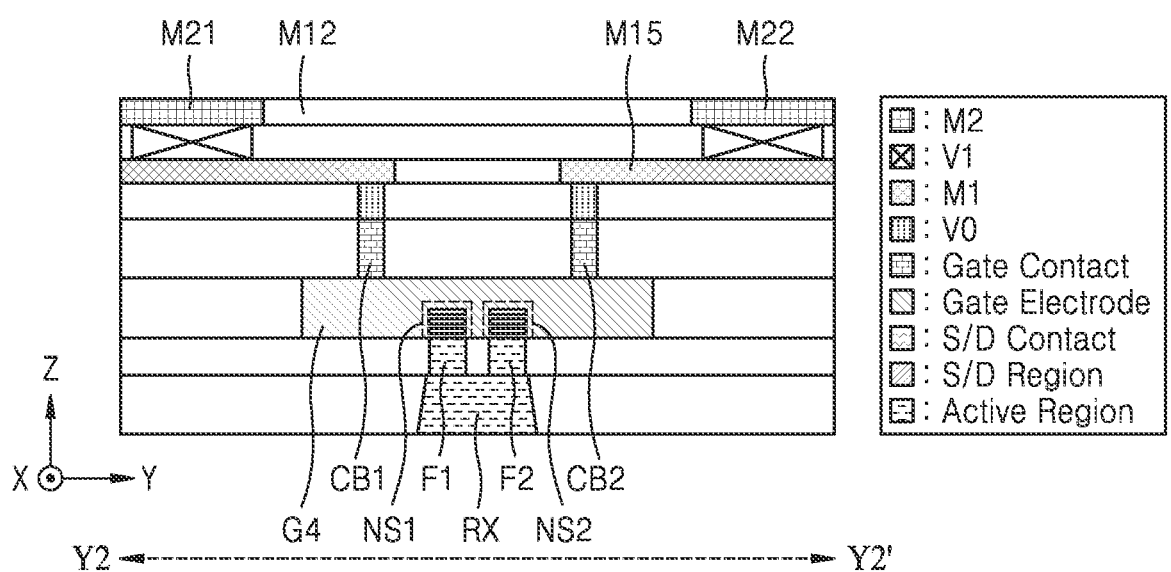

FIGS. 5A and 5B are cross-sectional views illustrating cross-sections of an integrated circuit, according to example embodiments. In detail, the cross-sectional view of FIG. 5A shows an example of the cross-section of the layout 20c of FIG. 2C, taken along the line Y1-Y1'. The cross-sectional view of FIG. 5B shows an example of the cross-section of the layout 20c of FIG. 2C, taken along the line Y2-Y2'. In the examples of FIGS. 5A and 5B, an integrated circuit may include an MBCFET as an example of a GAAFET. Although FIGS. 5A and 5B show the MBCFET including two nanosheet stacks each including three nanosheets, example embodiments are not limited thereto and an MBCFET may include different numbers of nanosheets and nanosheet stacks than the MBCFET in FIGS. 5A and 5B. In some example embodiments, the V0 layer in FIGS. 5A and 5B may be omitted, and a source/drain contact and a gate contact may be directly connected to a pattern of the first wiring layer M1.

Referring to FIG. 5A, at least one fin may extend on the active region RX in parallel with the X-axis, and a source/drain region may be formed on the fin. For example, as shown in FIG. 5A, the first and second fins F1 and F2 may extend on the active region RX in parallel with the X-axis, and the first and second source/drain regions SD1 and SD2 may be respectively formed on the first and second fins F1 and F2. In some example embodiments the first and second source/drain regions SD1 and SD2 may be merged into a single source/drain region.

The first source/drain contact CA1 may be formed on the first and second source/drain regions SD1 and SD2 and electrically connected to the seventh pattern M17 of the first wiring layer M1 through a via of the V0 layer. The seventh pattern M17 of the first wiring layer M1 may be electrically connected to the fourth pattern M24 of the second wiring layer M2 through a via of the V1 layer. Accordingly, the fourth pattern M24 of the second wiring layer M2 may be electrically connected to the first and second source/drain regions SD1 and SD2.

Referring to FIG. 5B, the fourth gate electrode G4 may extend in parallel with the Y-axis, and a first nanosheet stack NS1 and a second nanosheet stack NS2 may be respectively formed on the first and second fins F1 and F2. Each of the first and second nanosheet stacks NS1 and NS2 may include three nanosheets stacked in parallel with the Z-axis. The three nanosheets may extend in parallel with the X-axis and pass through the fourth gate electrode G4. A gate dielectric film may be formed between a nanosheet and the fourth gate electrode G4. Nanosheets may provide a channel for a transistor, and may be, in some example embodiments, constituted of a single material (e.g., Si).

The first gate contact CB1 and the second gate contact CB2 may be formed on the fourth gate electrode G4 and respectively and electrically connected to the second and fifth patterns M12 and M15 of the first wiring layer M1 through vias of the V0 layer. The second and fifth patterns M12 and M15 of the first wiring layer M1 may be respectively and electrically connected to the first and second patterns M21 and M22 of the second wiring layer M2 through vias of the V1 layer. In some example embodiments, a gate spacer may be formed on a side surface of the fourth gate electrode G4, and a gate dielectric film may be formed between the fourth gate electrode G4 and the gate spacer and on the bottom surface of the fourth gate electrode G4. A barrier film may be formed on the surface of a contact and/or a via.

Figure 6:
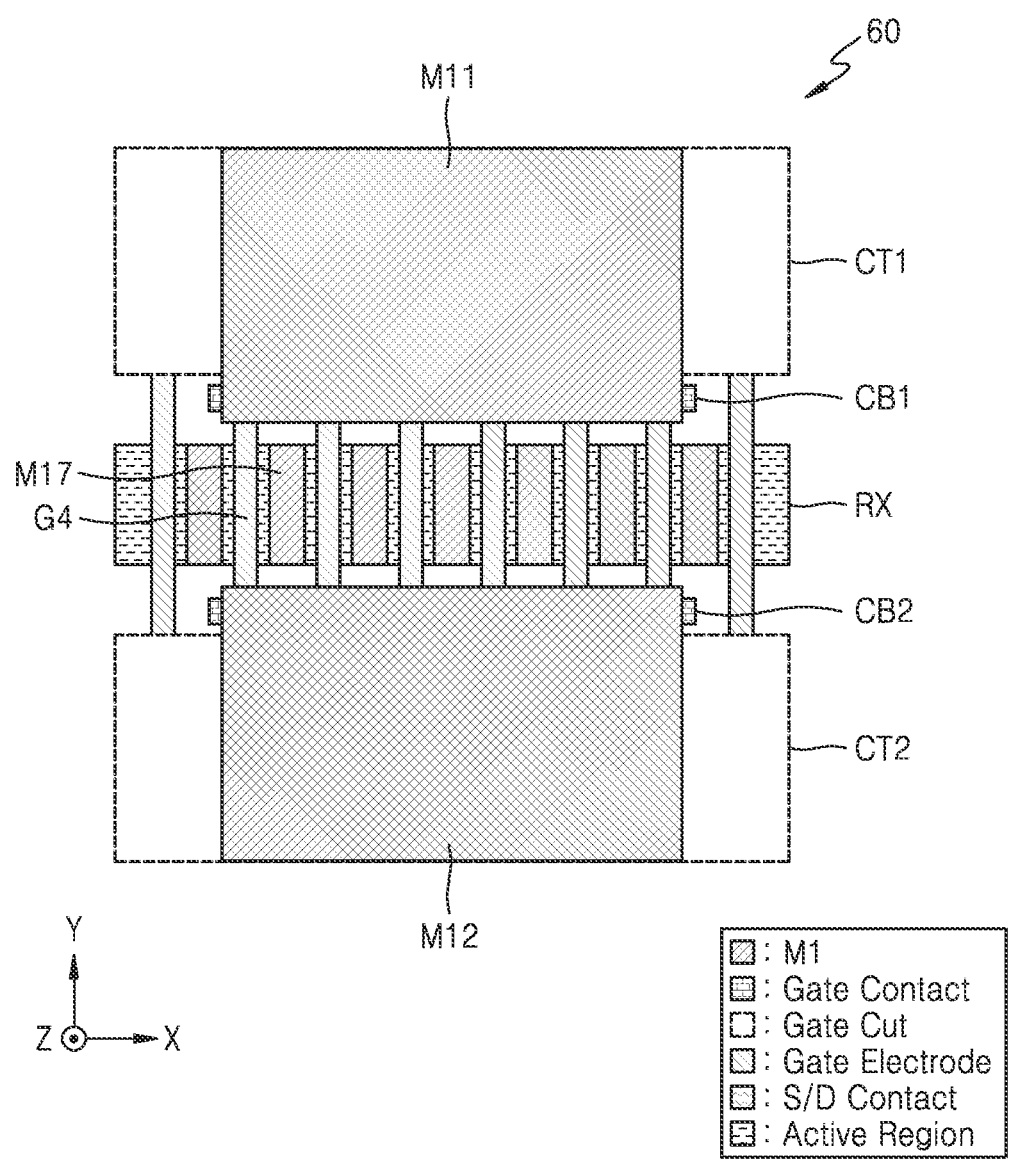
FIG. 6 is a plan view of a layout of an integrated circuit, according to an example embodiment.

FIG. 6 is a plan view of a layout 60 of an integrated circuit, according to an example embodiment. Compared to the layout 20b of FIG. 2B, patterns of the first wiring layer M1, which are electrically connected to a single gate contact, may be merged into a single pattern in the layout 60 of FIG. 6. Redundant descriptions given above with reference to FIGS. 2A and 2B are omitted from the descriptions of FIG. 6 below.

Referring to FIG. 6, the layout 60 may include the active region RX extending in parallel with the X-axis. The layout 60 may include a series of gates extending in parallel with the Y-axis, and the series of gates may be terminated by the first gate cut CT1 and the second gate cut CT2. The layout 60 may include the first and second gate contacts CB1 and CB2, which are connected to the series of gate electrodes and extend in parallel with the X-axis.

The layout 60 may include patterns, which are electrically connected to a gate contact and extend in the first wiring layer M1 in parallel with the Y-axis. For example, as shown in FIG. 6, the layout 60 may include the first pattern M11, which is electrically connected to the first gate contact CB1 and extends in parallel with the X-axis in the first wiring layer M1. The layout 60 may also include the second pattern M12, which is electrically connected to the second gate contact CB2 and extends in parallel with the X-axis in the first wiring layer M1. The first pattern M11 may be electrically connected to the first gate contact CB1 through one or more vias of the V0 layer. For example, the first pattern M11 may have more vias of the V0 layer, or a via having a larger cross-sectional area, than the first to third patterns M11 to M13 of the first wiring layer M1 in FIG. 2B. By having the additional vias or the via with the larger cross-sectional area, resistance due to the vias of the V0 layer may be decreased. Similarly, the second pattern M12 may be electrically connected to the second gate contact CB2 through one or more vias of the V0 layer. For example, the first pattern M11 may have more vias of the V0 layer, or a via having a larger cross-sectional area, than the fourth to sixth patterns M14 to M16 of the first wiring layer M1 in FIG. 2B. By having the additional vias or the via with the larger cross-sectional area, resistance due to the vias of the V0 layer may be decreased.

Figure 7:
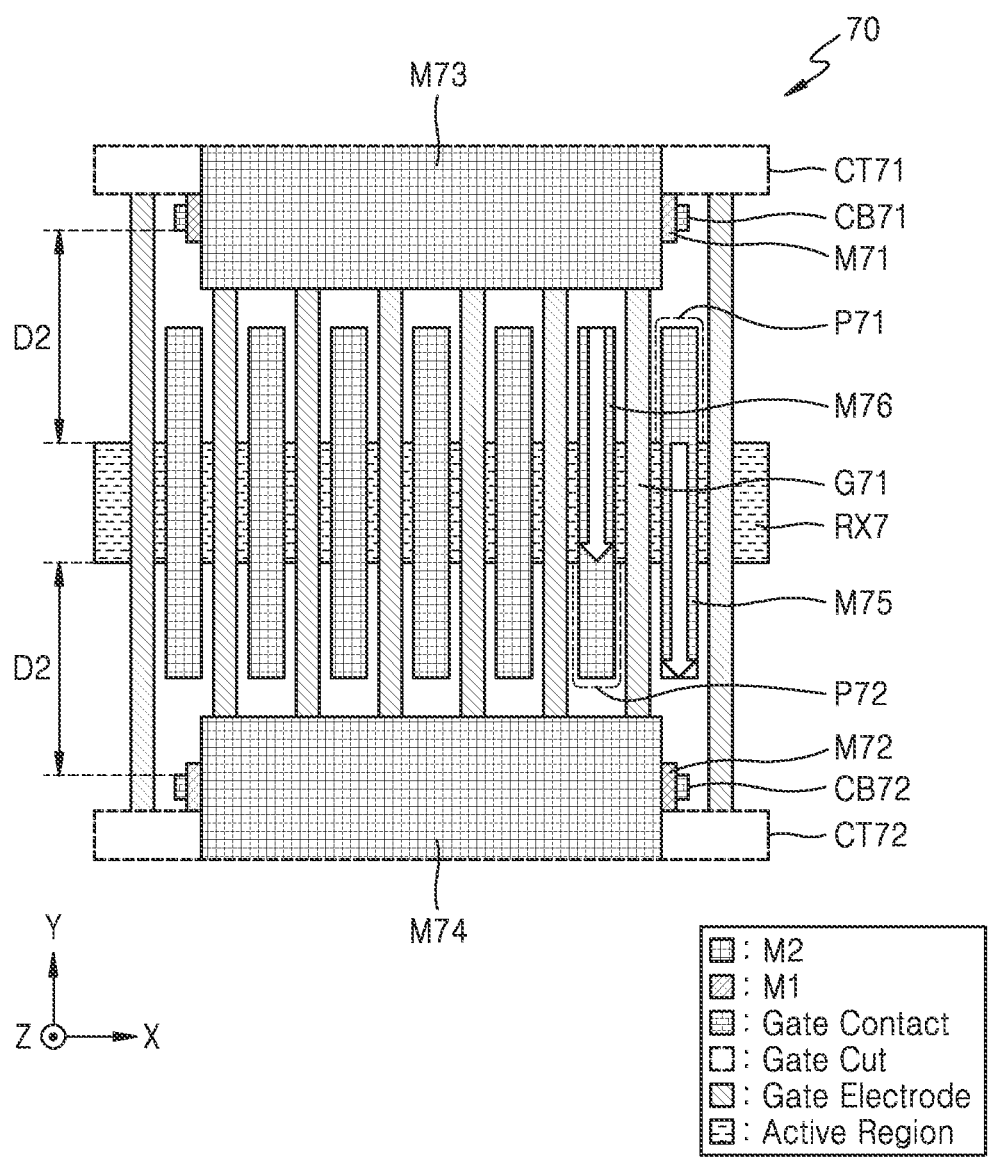
FIG. 7 is a plan view of a layout of an integrated circuit, according to a comparative example.

FIG. 7 is a plan view of a layout 70 of an integrated circuit, according to a comparative example, in which transistors are connected in parallel to each other.

Referring to FIG. 7, an active region RX7 may extend in parallel with the X-axis, and a series of gate electrodes may extend in parallel with the Y-axis. The series of gate electrodes, including a first gate electrode G71, may be terminated by a first gate cut CT71 and a second gate cut CT72. A first gate contact CB71 and a second gate contact CB72 may be connected to gate electrodes and extend in parallel with the X-axis. A first pattern M71 may be electrically connected to gate electrodes through the first gate contact CB71 and extend in parallel with the X-axis in the first wiring layer M1.

As shown in FIG. 7, the first gate contact CB71 and the first pattern M71 may extend in parallel with the X-axis below a third pattern M73 of the second wiring layer M2, and the second gate contact CB72 and a second pattern M72 may extend in parallel with the X-axis below a fourth pattern M74 of the second wiring layer M2. Accordingly, as shown in FIG. 7, a second distance D2, by which each of the first gate contact CB71 and the second gate contact CB72 is separated from the active region RX7 in the Y-axis direction, may be greater than the first distance D1 in FIG. 2A. A signal (e.g., the input A in FIG. 1) applied to gate electrodes may pass through a gate electrode of a length corresponding to the first distance D1 in the layouts 20a, 20b, 20c, and 20d of FIGS. 2A to 2D, while a signal input to an integrated circuit having the layout 70 may pass through a gate electrode of a length corresponding to the second distance D2. Accordingly, a distance, by which the signal passes through a gate electrode, which has a relatively high resistance when compared to patterns of the wiring layers, may increase in the layout 70 of FIG. 7 and the layout 70 may have a relatively long delay.

Referring to FIG. 7, the layout 70 may include patterns, which are respectively and electrically connected to source/drain regions and have the same length as each other in the second wiring layer M2. For example, as shown in FIG. 7, the layout 70 may include a fifth pattern M75, which is electrically connected to a source region (or a drain region) and extends in parallel with the Y-axis in the second wiring layer M2, and a sixth pattern M76, which is electrically connected to a drain region (or a source region) and extends in parallel with the Y-axis in the second wiring layer M2. As shown in FIG. 7, the fifth and sixth patterns M75 and M76 may have the same length as each other in the Y-axis direction, and accordingly, the capacitance between adjacent patterns of the second wiring layer M2 may be relatively high compared to the layout 20c of FIG. 2C.

Because the current driving a transistor flows from the sixth pattern M76 (or the fifth pattern M75) to the fifth pattern M75 (or the sixth pattern M76) through a channel as shown by arrows on the fifth and sixth patterns M75 and M76 in FIG. 7, a portion P71 of the fifth pattern M75 and a portion P72 of the sixth pattern M76 may be removed, and accordingly, the capacitance between patterns may be decreased as in the layout 20c of FIG. 2C.

Figure 8:
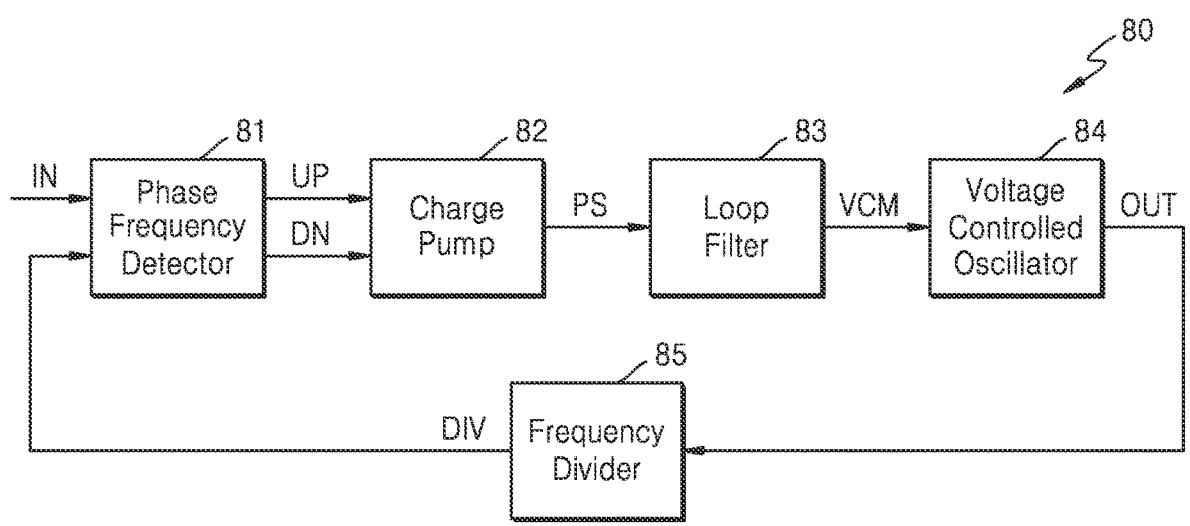
FIG. 8 is a block diagram of an integrated circuit according to an example embodiment.

FIG. 8 is a block diagram of an integrated circuit according to an example embodiment. In detail, the block diagram of FIG. 8 shows a phased-locked loop (PLL) 80 as an example of an integrated circuit.

The PLL 80 may be used to generate a clock signal having a desired frequency and phase. For example, the PLL 80 may be used to generate a signal for recovering data or a clock signal, which is received by a communication interface through a channel. The PLL 80 may also be used for dynamic voltage frequency scaling (DVFS) by controlling the frequency of a clock signal used for an operation of a digital circuit. To generate a signal that oscillates at a high frequency, the PLL 80 may include a high-speed device, and the high-speed device may include a plurality of transistors connected in parallel to each other, as described above with reference to the drawings. As shown in FIG. 8, the PLL 80 may include a phase frequency detector 81, a charge pump 82, a loop filter 83, a voltage-controlled oscillator 84, and a frequency divider 85, each of which includes circuitry such as transistors, capacitors, logic gates, and other circuit elements to implement certain functionality described in more detail below.

The phase frequency detector 81 may receive an input signal IN and a frequency-divided signal DIV and detect a phase difference and a frequency difference between the input signal IN and the frequency-divided signal DIV. The phase frequency detector 81 may generate an up signal UP and a down signal DN, based on the phase difference and the frequency difference.

The charge pump 82 may receive the up signal UP and the down signal DN from the phase frequency detector 81 and provide a pulse signal PS to the loop filter 83. The charge pump 82 may provide current to the loop filter 83 in response to the up signal UP that is activated and drain current from the loop filter 83 in response to the down signal DN that is activated. Accordingly, the pulse signal PS may be provided to the loop filter 83.

The loop filter 83 may receive the pulse signal PS from the charge pump 82 and generate a filtered signal VCM by filtering the pulse signal PS. The loop filter 83 may include a low-pass filter (LPF), and accordingly, the voltage of the filtered signal VCM may increase depending on the up signal UP that is activated and decrease depending on the down signal DN that is activated.

The voltage-controlled oscillator 84 may receive the filtered signal VCM and generate an output signal OUT, of which the frequency is controlled according to the filtered signal VCM. In some example embodiments, the voltage-controlled oscillator 84 may include a plurality of stages connected in series to each other. Each of the stages may have a delay, which is controlled according to the magnitude (e.g., the voltage and/or current) of the filtered signal VCM. For the output signal OUT that oscillates at a high frequency, a stage included in the voltage-controlled oscillator 84 may include a high-speed device including a plurality of transistors connected in parallel to each other. As described above with reference to the drawings, the transistors may provide reduced parasitic components and thus enable the output signal OUT to have a high frequency. An example of the stage included in the voltage-controlled oscillator 84 is described below with reference to FIGS. 9 and 10.

The frequency divider 85 may receive the output signal OUT from the voltage-controlled oscillator 84. The frequency divider 85 may generate the frequency-divided signal DIV from the output signal OUT according to a preset division factor.

Figure 9:
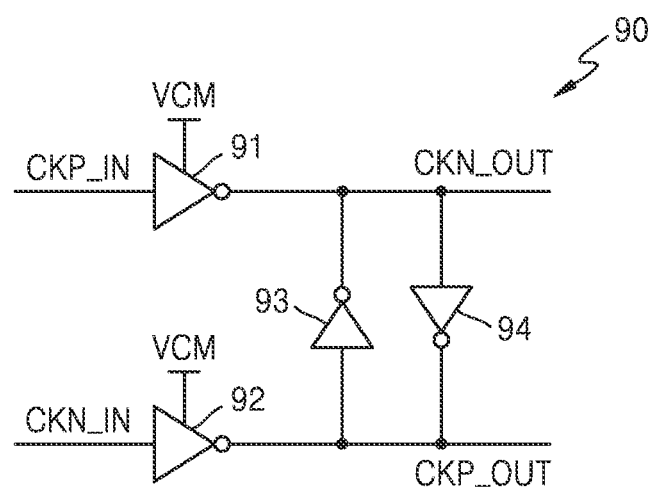
FIG. 9 is a diagram of an integrated circuit according to an example embodiment.

FIG. 9 is a diagram of an integrated circuit according to an example embodiment. In detail, the diagram of FIG. 9 shows a stage 90 included in a voltage-controlled oscillator. As shown in FIG. 9, the stage 90 may include first to fourth inverters 91 to 94.

The voltage-controlled oscillator including the stage 90 may receive and output differential signals. Accordingly, as shown in FIG. 9, first and second input signals CKP_IN and CKN_IN input to the stage 90 may correspond to differential signals, and first and second output signals CKN_OUT and CKP_OUT output from the stage 90 may also correspond to differential signals. The first inverter 91 may generate the first output signal CKN_OUT by inverting the first input signal CKP_IN, and the second inverter 92 may generate the second output signal CKP_OUT by inverting the second input signal CKN_IN.

The third inverter 93 may be cross coupled to the fourth inverter 94, as shown in FIG. 9. Accordingly, the third inverter 93 and the fourth inverter 94 may function as a latch and synchronize the rising and falling edges of the first and second output signals CKN_OUT and CKP_OUT with each other. As shown in FIG. 9, the third and fourth inverters 93 and 94 may be smaller than the first and second inverters 91 and 92 and drive a lower current than the first and second inverters 91 and 92.

To process and generate high-frequency signals, the first to fourth inverters 91 to 94 may include a high-speed device including a plurality of transistors connected in parallel to each other. An example of a layout of the stage 90 is described below with reference to FIG. 10.

Figure 10:
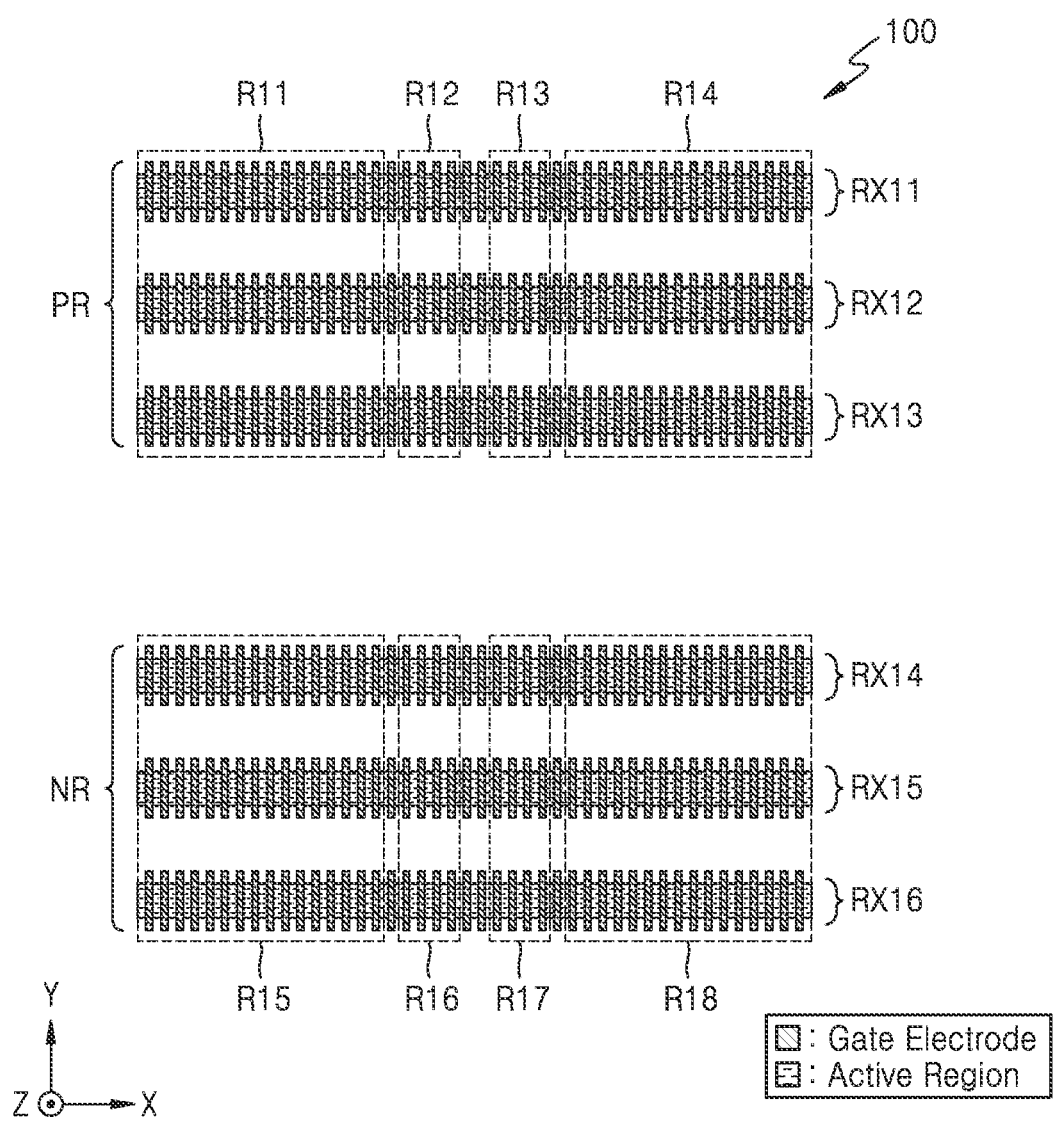
FIG. 10 is a plan view of a layout of an integrated circuit, according to an example embodiment.

FIG. 10 is a plan view of a layout 100 of an integrated circuit, according to an example embodiment. In detail, the plan view of FIG. 10 shows the layout 100 corresponding to the stage 90 of FIG. 9. For convenience of illustration, only active regions and gate electrodes are illustrated in the plan view of FIG. 10, but it will be understood that a plurality of transistors may be connected to each other, as described above with reference to the drawings. FIG. 10 is described below with reference to FIG. 9.

Referring to FIG. 10, the layout 100 may include a P-type transistor region PR and an N-type transistor region NR. In some example embodiments, when the layout 100 is formed in a P-type substrate, the P-type transistor region PR may be formed in an N-well formed in the P-type substrate. As shown in FIG. 10, first to third active regions RX11 to RX13 may extend in the P-type transistor region PR in parallel with the X-axis, and fourth to sixth active regions RX14 to RX16 may extend in the N-type transistor region NR in parallel with the X-axis. A series of gate electrodes may extend on each of the first to sixth active regions RX11 to RX16 in parallel with the Y-axis.

In some example embodiments, transistors included in a high-speed device may be formed in at least two active regions extending in parallel with each other. For example, a P-type transistor, as a high-speed device included in the first inverter 91, may be implemented by transistors included in a first region R11. The transistors included in the first region R11 may be formed in the first to third active regions RX11 to RX13. An N-type transistor, as a high-speed device included in the first inverter 91, may be implemented by transistors included in a fifth region R15. The transistors included in the fifth region R15 may be formed in the fourth to sixth active regions RX14 to RX16. Similarly, one of two high-speed devices included in the second inverter 92 may be implemented by transistors included in a fourth region R14, and the other high-speed device included in the second inverter 92 may be constituted of transistors included in an eighth region R18. One of two high-speed devices included in the third inverter 93 may be implemented by transistors included in a second region R12, and the other high-speed device included in the third inverter 93 may be constituted of transistors included in a sixth region R16. One of two high-speed devices included in the fourth inverter 94 may be implemented by transistors included in a third region R13, and the other high-speed device included in the fourth inverter 94 may be implemented by transistors included in a seventh region R17. As described above with reference to the drawings, high-speed devices included in each of the first to fourth inverters 91 to 94 may include a plurality of transistors connected in parallel o each other to provide low parasitic components, and accordingly, the layout 100 may provide a high operating speed.

Figure 11:
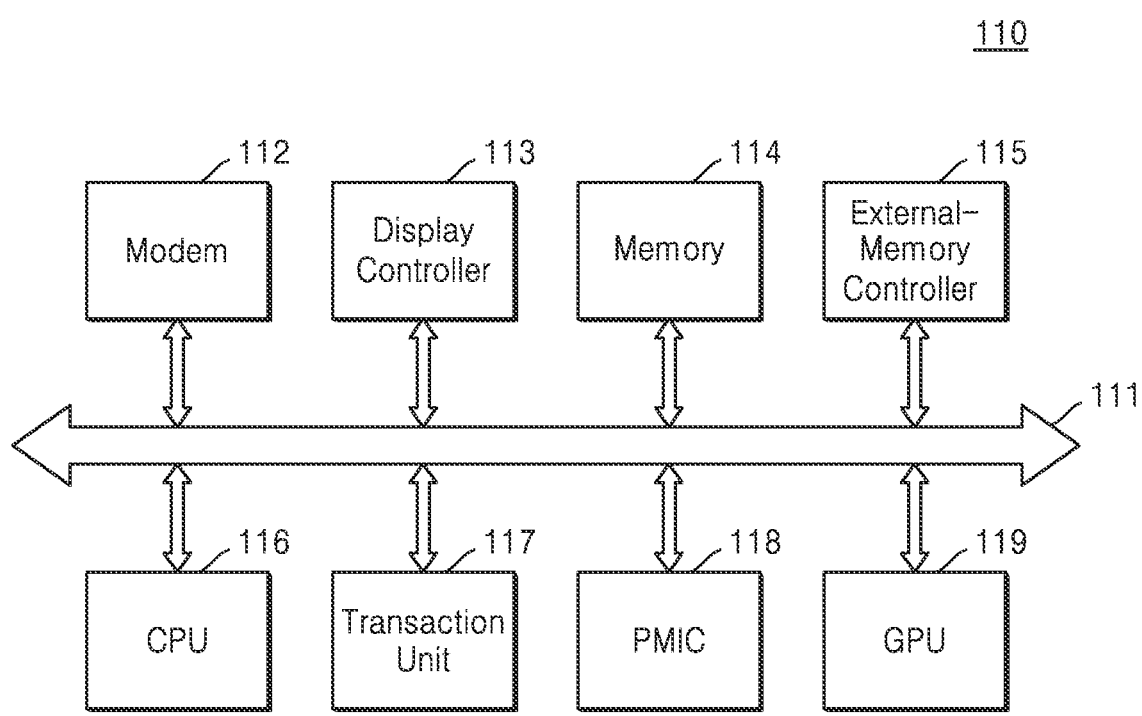
FIG. 11 is a block diagram of a system-on-chip (SoC) according to an example embodiment.

FIG. 11 is a block diagram of a system-on-chip (SoC) 110 according to an example embodiment. As a semiconductor apparatus, the SoC 110 may include an integrated circuit according to an example embodiment. For example, the SoC 110 may be realized by implementing complex functional blocks, such as intellectual property (IP) blocks, which perform various functions, in a single chip. For example, an IP block may include circuitry to perform specific functions, and may have a design that includes a trade secret. The SoC 110 may include a high-speed device including a plurality of transistors connected in parallel to each other to provide low parasitic components and thus provide a high operating speed. Referring to FIG. 11, the SoC 110 may include a modem 112, a display controller 113, a memory 114, an external memory controller 115, a central processing unit (CPU) 116, a transaction unit 117, a power management integrated circuit (PMIC) 118, and a graphics processing unit (GPU) 119. The functional blocks of the SoC 110 may include circuitry, such as transistors, capacitors, logic gates, and other circuit elements to implement certain functionality described in more detail below. and may communicate with each other through a system bus 111.

The CPU 116 may control the operations of the SoC 110 in a top layer and thus control the operations of the other functional blocks, i.e., the modem 112, the display controller 113, the memory 114, then external memory controller 115, the transaction unit 117, the PMIC 118, and the GPU 119. The modem 112 may demodulate a signal received from the outside of the SoC 110 or modulate a signal generated in the SoC 110 and transmit the modulated signal to the outside. The external memory controller 115 may control data exchange with an external memory device connected to the SoC 110. For example, a program and/or data stored in the external memory device may be provided to the CPU 116 or the GPU 119 under the control of the external memory controller 115. The GPU 119 may execute program instructions related to graphics processing. The GPU 119 may receive graphics data through the external memory controller 115, process the graphics data, and transmit the processed graphics data to the outside of the SoC 110 through the external memory controller 115. The transaction unit 117 may monitor data transactions of each functional block. The PMIC 118 may control power supplied to each functional block under the control of the transaction unit 117. The display controller 113 may control a display (or a display device) outside the SoC 110 such that data, which is generated in the SoC 110, may be transmitted to the display. The memory 114 may include non-volatile memory, such as electrically erasable programmable read-only memory (EEPROM) or flash memory, or volatile memory, such as dynamic random access memory (DRAM) or static RAM (SRAM).

While aspects of example embodiments have been particularly shown and described, it will be understood that various changes in form and details may be made therein without departing from the spirit and scope of the following claims.

What is claimed is:

1. An integrated circuit comprising:
an active region extending in a first direction;
a plurality of gate electrodes extending in a second direction in parallel with each other, the second direction being perpendicular to the first direction;
a plurality of source/drain regions provided on the active region between the plurality of gate electrodes;
a first gate contact connected to the plurality of gate electrodes and extending in the first direction;
a plurality of first gate wiring patterns provided in a first wiring layer, wherein each of the plurality of first gate wiring patterns are electrically connected to each of the plurality of gate electrodes through the first gate contact, wherein the plurality of first gate wiring patterns are spaced apart from each other along the first direction, wherein the plurality of first gate wiring patterns extend farther in the second direction than the first gate contact extends in the second direction, and wherein the first gate contact extends between the plurality of gate electrodes and the plurality of first gate wiring patterns along a third direction perpendicular to the first direction and the second direction; and
a plurality of source/drain wiring patterns provided in a second wiring layer, electrically connected to the plurality of source/drain regions, respectively, extending in parallel with the second direction, and overlapping the plurality of source/drain regions along the third direction, the second wiring layer being provided on the first wiring layer,
wherein the first gate contact overlaps at least one of the plurality of source/drain wiring patterns along the third direction.

2. The integrated circuit of claim 1, further comprising:
a second gate contact connected to the plurality of gate electrodes and extending in the first direction; and
at least one second gate wiring pattern provided in the first wiring layer, electrically connected to the plurality of gate electrodes through the second gate contact, and wherein the second gate contact extends between the plurality of gate electrodes and the at least one second gate wiring pattern along the third direction,
wherein the second gate contact overlaps at least one of the plurality of source/drain wiring patterns along the third direction.

3. The integrated circuit of claim 2, wherein the active region and a region between the first gate contact and the second gate contact overlap, along the third direction.

4. The integrated circuit of claim 3, wherein the plurality of gate electrodes have a minimum length in the second direction between the active region and the first gate contact and between the active region and the second gate contact.

5. The integrated circuit of claim 2, wherein the plurality of source/drain regions comprises:
a plurality of source regions electrically connected to each other; and
a plurality of drain regions electrically connected to each other, and
wherein the plurality of source/drain wiring patterns comprises:
source wiring patterns provided in the second wiring layer, and extending in the second direction from regions overlapping the plurality of source regions to regions overlapping the first gate contact, along the third direction; and
drain wiring patterns provided in the second wiring layer, and extending in an opposite direction to the second direction from regions overlapping the plurality of drain regions to regions overlapping the second gate contact, along the third direction.

6. The integrated circuit of claim 5, wherein each of the source wiring patterns has an end which overlaps the active region along the third direction, and
wherein each of the drain wiring patterns has an end which overlaps the active region along the third direction.

7. The integrated circuit of claim 5, further comprising:
a first pattern provided in a third wiring layer provided on the second wiring layer, electrically connected to the source wiring patterns, and extending in the first direction; and a second pattern provided in the third wiring layer, electrically connected to the drain wiring patterns, and extending in the first direction.

8. The integrated circuit of claim 1, wherein each of the plurality of first gate wiring patterns overlaps two of the plurality of gate electrodes along the third direction.

9. The integrated circuit of claim 1, wherein the plurality of first gate wiring patterns comprises a pattern overlapping two of the plurality of gate electrodes along the third direction.

10. The integrated circuit of claim 1, wherein a distance in the second direction between the first gate contact and the active region is a minimum space defined by a semiconductor process.

11. An integrated circuit comprising:
an active region extending in a first direction;
a plurality of gate electrodes extending in a second direction in parallel with each other, the second direction being perpendicular to the first direction;
a plurality of source regions each provided on the active region between gate electrodes and electrically connected to each other;
a plurality of drain regions each provided on the active region between gate electrodes and electrically connected to each other;
source wiring patterns electrically connected to the plurality of source regions, respectively, and extending in the second direction from regions which overlap the plurality of source regions, along a third direction perpendicular to the first direction and the second direction;
a first gate contact and a second gate contact, the first gate contact and the second gate contact being connected to the plurality of gate electrodes and extending in the first direction in parallel with each other,
a plurality of first gate wiring patterns electrically connected to each of the plurality of gate electrodes through the first gate contact, wherein the plurality of first gate wiring patterns are spaced apart from each other along the first direction, wherein the plurality of first gate wiring patterns extend farther in the second direction than the first gate contact extends in the second direction, and wherein the first gate contact extends between the plurality of gate electrodes and the plurality of first gate wiring patterns;
a plurality of second gate wiring patterns electrically connected to each of the plurality of gate electrodes through the second gate contact, wherein the plurality of second gate wiring patterns are spaced apart from each other along the first direction, and wherein the second gate contact extends between the plurality of gate electrodes and the plurality of second gate wiring patterns; and
drain wiring patterns electrically connected to the plurality of drain regions, respectively, and extending in an opposite direction to the second direction from regions which overlap the plurality of drain regions, along the third direction.

12. The integrated circuit of claim 11, wherein each of the source wiring patterns and each of the drain wiring patterns comprises an end which overlaps the active region along the third direction.

13. The integrated circuit of claim 11, wherein the active region and a region between the first gate contact and the second gate contact overlap, along the third direction,
wherein the source wiring patterns extend in the second direction to overlap the first gate contact along the third direction, and
wherein the drain wiring patterns extend in the opposite direction to the second direction to overlap the second gate contact along the third direction.

14. The integrated circuit of claim 13, wherein the plurality of first gate wiring patterns extend in a first wiring layer to a region between the first gate contact and the source wiring patterns,
wherein the plurality of second gate wiring patterns extend in the first wiring layer to a region between the second gate contact and the drain wiring patterns, and
wherein the source wiring patterns and the drain wiring patterns are provided in a second wiring layer that is provided on the first wiring layer.

15. An integrated circuit comprising:
an active region extending in a first direction;
a plurality of gate electrodes extending in a second direction in parallel with each other and forming a plurality of transistors on the active region, the second direction being perpendicular to the first direction;
a first gate contact connected to the plurality of gate electrodes and extending in the first direction;
a plurality of first gate wiring patterns provided in a first wiring layer, and electrically connected to each of the plurality of gate electrodes through the first gate contact, wherein the plurality of first gate wiring patterns are spaced apart from each other along the first direction; and
a plurality of source/drain wiring patterns provided in a second wiring layer above the first wiring layer, electrically connected to sources and drains of the plurality of transistors, respectively, and extending in parallel with the second direction,
wherein the first gate contact extends between the plurality of gate electrodes and the plurality of first gate wiring patterns along a third direction perpendicular to the first direction and the second direction,
wherein the plurality of first gate wiring patterns extend to a region between the first gate contact and at least one of the plurality of source/drain wiring patterns, and
wherein the plurality of transistors are connected in parallel to each other.

16. The integrated circuit of claim 15, further comprising:
a second gate contact connected to the plurality of gate electrodes and extending in the first direction; and
a plurality of second gate wiring patterns provided in the first wiring layer, and electrically connected to each of the plurality of gate electrodes through the second gate contact,
wherein the plurality of second gate wiring patterns are spaced apart from each other along the first direction, and
wherein the plurality of second gate wiring patterns extend to a region between the second gate contact and at least one of the plurality of source/drain wiring patterns.

17. The integrated circuit of claim 16, wherein the active region and a region between the first gate contact and the second gate contact overlap, along the third direction.

18. The integrated circuit of claim 16, wherein the plurality of source/drain wiring patterns comprise:
source wiring patterns provided in the second wiring layer, and overlapping the active region and the first gate contact, along the third direction; and drain wiring patterns provided in the second wiring layer, and overlapping the active region and the second gate contact, along the third direction.

19. The integrated circuit of claim 15, wherein the plurality of first gate wiring patterns comprises a pattern overlapping two of the plurality of gate electrodes along the third direction.

20. The integrated circuit of claim 11, wherein the plurality of first gate wiring patterns comprises a pattern overlapping two of the plurality of gate electrodes along the third direction.

* * * * *